US012796455B2

(12) United States Patent
Chen et al.

(10) Patent No.: US 12,796,455 B2
(45) Date of Patent: Nov. 10, 2026

(54) THIN FILM RESISTOR WITH GRADED RESISTIVE LAYER

(71) Applicant: Taiwan Semiconductor Manufacturing Company, Ltd., Hsinchu (TW)

(72) Inventors: Chun-Heng Chen, Hsinchu City (TW); Hsin-Li Cheng, Hsinchu (TW); Ru-Shang Hsiao, Jhubei City (TW); Shih-Fen Huang, Jhubei (TW); Tuo-Hsin Chien, Zhubei City (TW); Yu-Wei Liang, Kaohsiung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 762 days.

(21) Appl. No.: 18/307,977

(22) Filed: Apr. 27, 2023

(65) Prior Publication Data

US 2024/0363529 A1 Oct. 31, 2024

(51) Int. Cl.
*H10W 20/40* (2026.01)
*H10D 1/47* (2025.01)

(52) U.S. Cl.
CPC .......... *H10W 20/498* (2026.01); *H10D 1/474* (2025.01)

(58) Field of Classification Search
CPC ............................ H10W 20/498; H10D 1/474
See application file for complete search history.

(56) References Cited

U.S. PATENT DOCUMENTS 6,083,785 A * 7/2000 Segawa .................... H10D 1/20 257/E27.105
7,332,403 B1 * 2/2008 Hill .......................... H10D 1/47 257/E27.047
8,298,902 B2 * 10/2012 Dalton ..................... H10D 1/47 438/618
8,530,320 B2 * 9/2013 Yang ...................... H10D 1/474 438/384
9,905,633 B1 * 2/2018 Yang ................. H01L 21/76816
2004/0239478 A1 * 12/2004 Amadon .................. H01C 7/06 338/308
(Continued)

FOREIGN PATENT DOCUMENTS

TW 202316451 A 4/2023

*Primary Examiner* — Kyung S Lee
(74) *Attorney, Agent, or Firm* — Harrity & Harrity, LLP

(57) ABSTRACT

Some implementations described herein include a semiconductor device including a semiconductor resistor structure having and techniques for forming the semiconductor resistor structure. The techniques include forming a layer of a silicon chromium material having different silicon/chromium ratios within the layer (e.g., a graded resistive layer) as part of forming the semiconductor resistor structure. The graded resistive layer may compensate for semiconductor manufacturing processes (e.g., etching, oxidation, thermal annealing) that may lead to film damage, thinning, crystallization, or composition drift of the graded resistive layer to enlarge process windows for fabricating the semiconductor resistor structure. The enlarged process window may improve a performance of the semiconductor resistor structure (e.g., a resistance and/or an impedance uniformity) relative to another semiconductor resistor structure fabricated using a uniform layer of a silicon chromium material.

20 Claims, 22 Drawing Sheets

(56) References Cited

U.S. PATENT DOCUMENTS

| | | | | |
|---|---|---|---|---|
| 2006/0181388 | A1* | 8/2006 | Chinthakindi | H10D 1/474<br>257/E27.026 |
| 2007/0176295 | A1* | 8/2007 | Chinthakindi | H10D 88/00<br>438/666 |
| 2009/0302993 | A1* | 12/2009 | Fujiwara | H01L 23/5228<br>338/314 |
| 2010/0237467 | A1* | 9/2010 | Dalton | H01L 21/76832<br>257/E29.325 |
| 2010/0308436 | A1* | 12/2010 | Nanjo | H10D 84/209<br>257/536 |
| 2012/0313220 | A1 | 12/2012 | Yang et al. | |
| 2013/0121057 | A1 | 5/2013 | Le | |
| 2017/0221797 | A1* | 8/2017 | Tseng | H01L 23/485 |
| 2021/0134940 | A1* | 5/2021 | Kuo | H10D 1/474 |
| 2021/0391253 | A1 | 12/2021 | Yang | |
| 2023/0058805 | A1 | 2/2023 | Tanaka | |
| 2023/0116260 | A1 | 4/2023 | Ito et al. | |

* cited by examiner

THIN FILM RESISTOR WITH GRADED RESISTIVE LAYER

BACKGROUND

Semiconductor-based integrated circuits may include a wide range of semiconductor devices. These semiconductor devices may include active semiconductor devices and/or passive semiconductor devices. Active semiconductor devices may include transistors and other semiconductor devices that operate using a power source. Passive semiconductor devices include inductors, capacitors, resistors, and/or other semiconductor devices that can operate without a power source. Resistors are widely used in many applications, such as resistor-capacitor (RC) circuits, power drivers, power amplifiers, and/or radio frequency (RF) applications, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
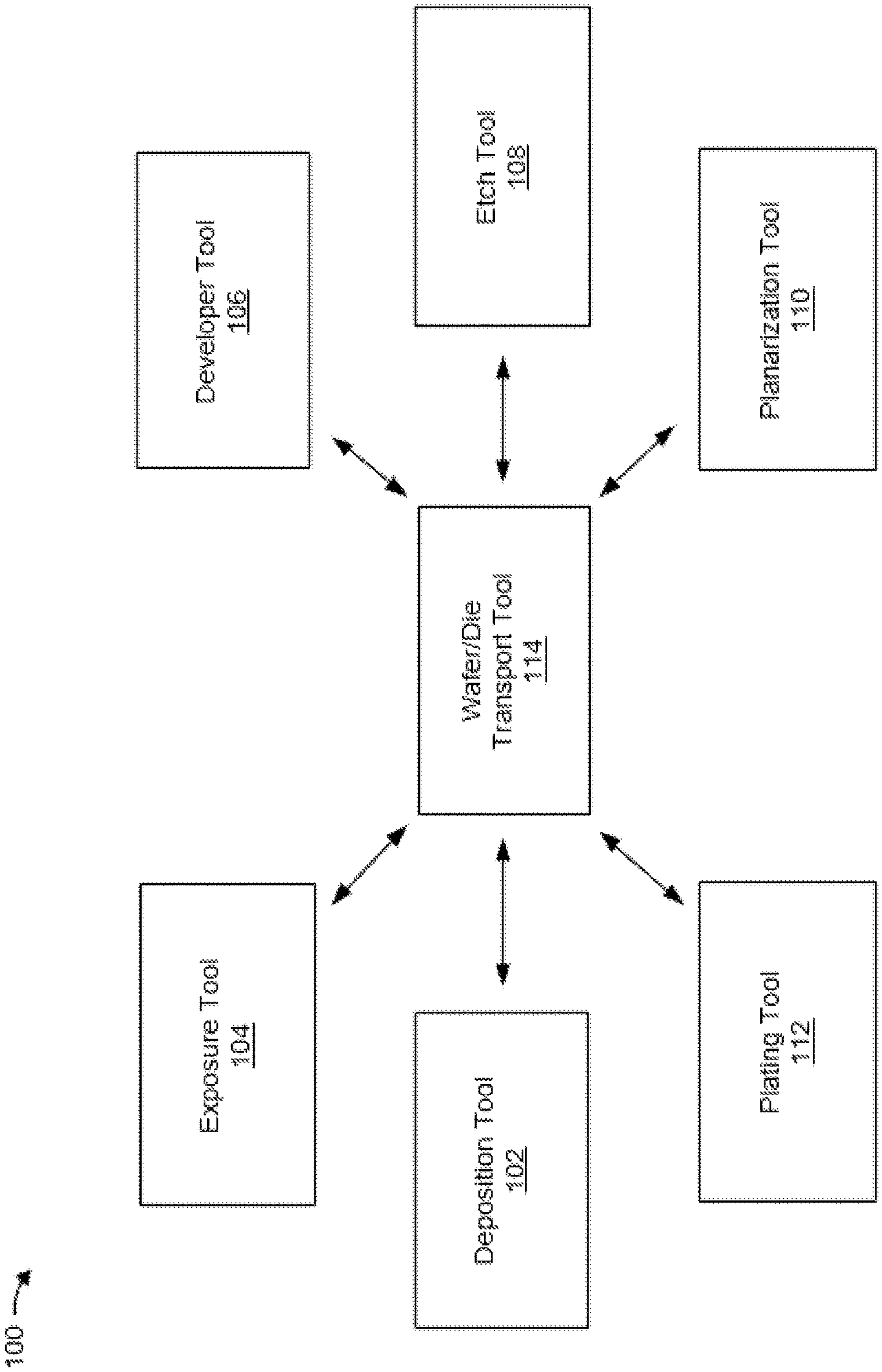
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor resistor structure, such as a thin film resistor (TFR), may be formed in a semiconductor device. For an application in which the semiconductor device is exposed to an extreme temperature range, a zero temperature coefficient of resistance (TCR) may be desired for the semiconductor resistor structure so that a performance of the semiconductor resistor structure (e.g., a resistance or an impedance) remains consistent across the extreme temperature range.

A layer of a silicon chromium material (SiCr) having a uniform Si/Cr ratio throughout the layer may be used to form the semiconductor resistor structure. However, during manufacturing of the semiconductor resistor structure, exposure of the layer of the silicon chromium material to semiconductor manufacturing processes (e.g., etching, oxidation, thermal annealing) may lead to film damage, thinning, crystallization, or composition drift (e.g., a change in the target Si/Cr ratio) that causes the performance of the semiconductor resistor structure to shift. As a result, a performance of the semiconductor device (an operating margin for a diode threshold voltage, among other examples) may not satisfy a reliability threshold.

Some implementations described herein include a semiconductor device including a semiconductor resistor structure and techniques for forming the semiconductor resistor structure. The techniques include forming a layer of a silicon chromium (SiCr) material having different Si/Cr ratios within the layer (e.g., a graded resistive layer) as part of forming the semiconductor resistor structure. The graded resistive layer may compensate for semiconductor manufacturing processes (e.g., etching, oxidation, thermal annealing) that may lead to film damage, thinning, crystallization, or composition drift of the graded resistive layer to enlarge process windows for fabricating the semiconductor resistor structure. Additionally, or alternatively, an enlarged process window may improve a performance of the semiconductor resistor structure (e.g., a resistance and/or an impedance uniformity) relative to another semiconductor resistor structure fabricated using a uniform layer of a silicon chromium material.

In this way, a performance (e.g., a reliability margin) of a semiconductor device including the semiconductor resistor structure is improved. Improving the performance of the semiconductor device may increase a manufacturing yield, of the semiconductor device, to a particular performance threshold, thereby reducing an amount of resources required to support a market that consumes a volume of the semiconductor device satisfying the particular performance threshold (e.g., semiconductor processing tools, labor, raw material, and/or computing resources).

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform a series of semiconductor processing operations that form a semiconductor resistor structure described herein. For example, the series of semiconductor processing operations may include method forming a graded resistive layer over a dielectric layer. The series of semiconductor processing operations may include forming a capping structure over the graded resistive layer. The series of semiconductor processing operations may include forming an interconnect structure over the capping structure. In some implementations, one or more of the semiconductor processing tools 102-112 and/or the wafer/die transport tool 114 may perform one or more operations described in connection with FIGS. 2, 3A-3G, 4, 5A-5J, 6, and/or 7 among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
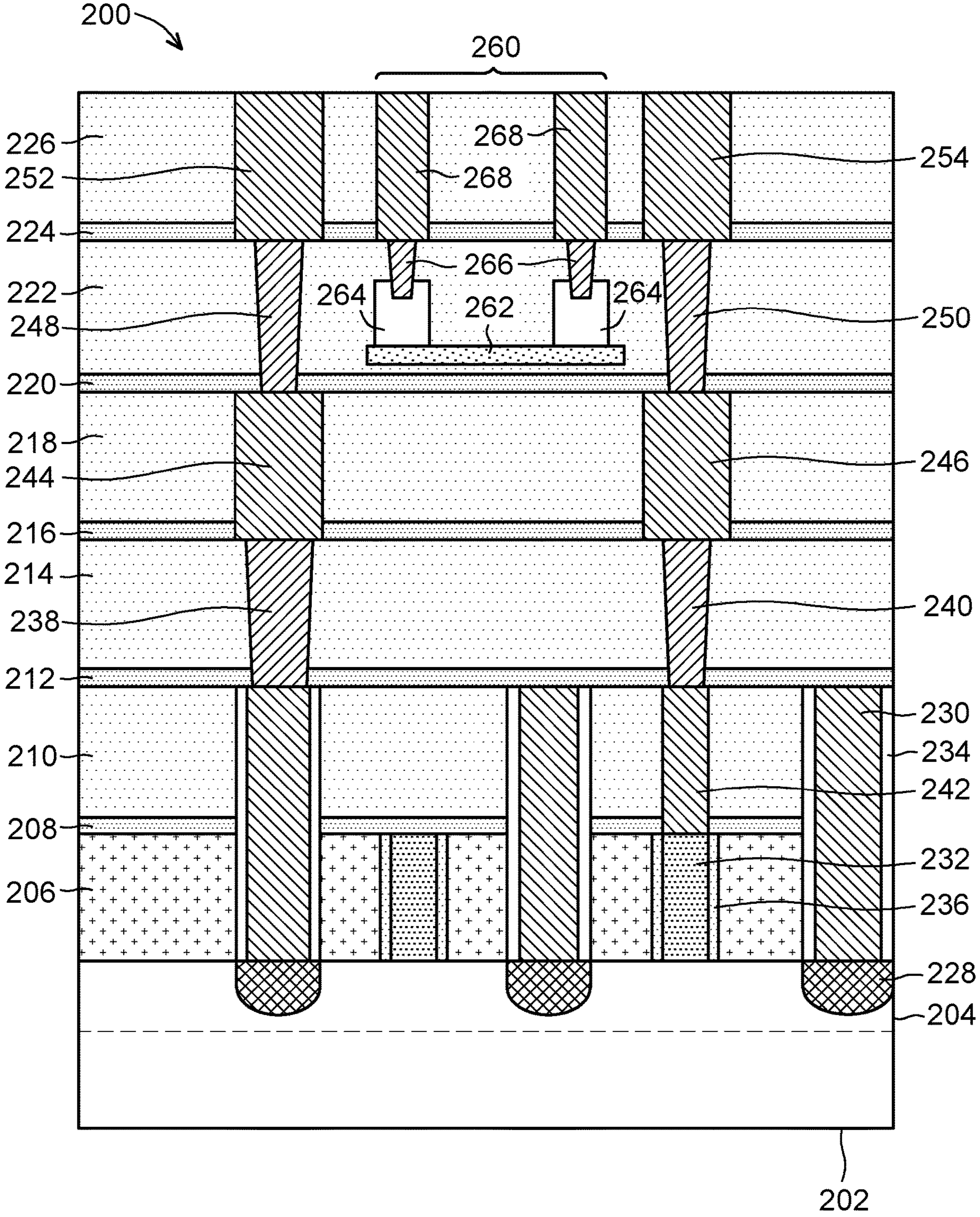
FIG. 2 is a diagram of an example semiconductor structure described herein.

FIG. 2 is a diagram of a portion of an example semiconductor device 200 described herein. The semiconductor device 200 includes an example of a semiconductor device, such as a semiconductor memory device (e.g., a static random access memory (SRAM), a dynamic random access memory (DRAM)), a semiconductor logic device, a processor, an input/output device, or another type of semiconductor device that includes one or more transistors.

The semiconductor device 200 includes a substrate 202 (e.g., a silicon substrate) and one or more fin structures 204. The semiconductor device 200 further includes one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the semiconductor device 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the semiconductor device 200 (or the layers included therein) to be selectively etched or protected from etching to form one or more of the structures included in the semiconductor device 200.

As further shown in FIG. 2, the semiconductor device 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the semiconductor device 200.

The epitaxial regions 228 are electrically connected to metal source or drain contacts 230 of the transistors included in the semiconductor device 200. The metal source or drain contacts (MDs or CAs) 230 include cobalt (Co), ruthenium (Ru), and/or another conductive or metal material. The transistors further include gates 232 (MGs), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the semiconductor device 200 and/or electrically connect the transistors to other areas and/or components of the semiconductor device 200. In some implementations, the interconnects electrically connect the transistors to a back end of line (BEOL) region of the semiconductor device 200.

The metal source or drain contacts 230 are electrically connected to source or drain interconnects 238 (e.g., source/drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of Conductive layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the Conductive layers of the semiconductor device 200 includes additional metallization layers and/or vias that connect the semiconductor device 200 to a package. The BEOL region of the semiconductor device 200 may refer to the region of the semiconductor device 200 above the ESL 208, including the structures/layers 210-226 and 238-254.

As further shown in FIG. 2, the semiconductor device 200 may include one or more devices and/or structures in the BEOL region of the semiconductor device 200. For example, the semiconductor device 200 may include one or more semiconductor resistor structures 260 in the BEOL region of the semiconductor device 200. The semiconductor resistor structure 260 may be included in one or more of the dielectric layers 210, 214, 218, 222, and/or 226 in the BEOL region of the semiconductor device 200. Accordingly, the semiconductor resistor structure 260 may be referred to as a resistor structure or a thin-film resistor (TFR) structure, among other examples.

The semiconductor resistor structure 260 includes a graded resistive layer 262. The graded resistive layer 262 may include one or more materials configured to provide electrical resistance. In some implementations, the graded resistive layer 262 includes silicon chromium (SiCr) resistive material. Silicon chromium resistive material may provide a reduced temperature coefficient of resistance (TCR) relative to other types of resistive material (e.g., polysilicon resistive materials). The reduced TCR may result in reduce changes in resistance in the semiconductor resistor structure 260, relative to a semiconductor resistor structure that includes polysilicon resistive materials, due to heat. In some implementations, a thickness of the graded resistive layer 262 may be included in a range of approximately 50 angstroms to approximately 600 angstroms. However, other values for the range are within the scope of the present disclosure.

The semiconductor resistor structure 260 includes capping structures 264 over and/or on the graded resistive layer 262. The capping structures 264 are electrically connected with the graded resistive layer 262 and provide an input to, and an output from, the graded resistive layer 262. Thus, the capping structures 264 function as the terminals of the semiconductor resistor structure 260. The capping structures 264 may each include one or more electrically conductive materials, such as titanium nitride (TiN), a ceramic material, a metal material, a metal alloy, and/or another electrically conductive material, among other examples. The capping structures 264 may be spaced apart by the dielectric layer 222 such that the capping structures 264 are electrically isolated to reduce the likelihood of electrical shorting between the capping structures 264. The capping structures 264 may be physically coupled and/or electrically coupled with rows of vertical interconnect access structures (vias) 266 and/or another type of interconnect.

The rows of vias 266 may be physically coupled and/or electrically coupled with conductive structures 268 and/or another type of metallization layer. The rows of vias 266, and/or the conductive structures 268, may include materials similar to those included in one or more of the structures 238-254. The rows of vias 266 may be included in the dielectric layer 222 and may respectively extend into a portion of the capping structures 264. The conductive structures 268 may be included in the dielectric layer 226 and may be extend through the ESL 224. In some implementations, the conductive structures 268 are top metal layers in the semiconductor device 200.

As indicated above, FIG. 2 is provided as an example. Other examples may differ from what is described with regard to FIG. 2.

FIGS. 3A-3G are diagrams of example implementations 300 of a graded resistive layer described herein. The graded resistive layer may correspond to the graded resistive layer 262 within the semiconductor resistor structure 260 as described in connection with FIG. 2 and elsewhere herein. In FIGS. 3A-3G, example profiles **302*a*-302*g* are illustrated in terms of a silicon-to-chromium ratio 304 (e.g., an Si/Cr ratio) versus a depth 306 from a top surface of the graded resistive layer 262**.

In some implementations, the graded resistive layer 262 is formed by the deposition tool 102 of FIG. 1. As an example, the deposition tool 102 may form the graded resistive layer 262 using PVD process (e.g., a sputtering process). The sputtering process may include placing a semiconductor substrate (e.g., the substrate 202) on an anode in a processing chamber, in which a gas (e.g., argon or another chemically inert gas) is supplied and ignited to form a plasma of ions of the gas. The ions in the plasma are accelerated toward a cathode (e.g., an element target) formed of the material to be deposited (e.g., a chromium-rich material, a silicon-rich material, or a bulk chromium silicon material), which cases the ions to bombard the cathode and release particles of the material. The anode attracts the particles, which causes the particles to travel toward and deposit onto the wafer. In some implementations, the sputtering process is performed in a chamber including a combination of cathodes (e.g., a combination of element targets). In some implementations, the sputtering process is performed in separate chambers including separate cathodes (e.g., separate element targets).

Alternatively, the deposition tool 102 may form the graded resistive layer 262 using an atomic layer deposition (ALD) process. The ALD process includes the use of sequential gas-phase precursors (e.g., a chromium-rich precursor, a silicon-rich precursor, or a bulk chromium silicon precursor) that each separately react with a surface of a material in a self-limiting manner. A first gas-phase precursor is introduced into a processing chamber to react with the surface of the material. The first gas-phase precursor is then removed from the processing chamber, and a second gas-phase precursor is introduced into the processing chamber to react with the surface of the material. This alternating process is repeated to grow or otherwise form a film on the surface in a highly-controlled manner.

Figure 3A:
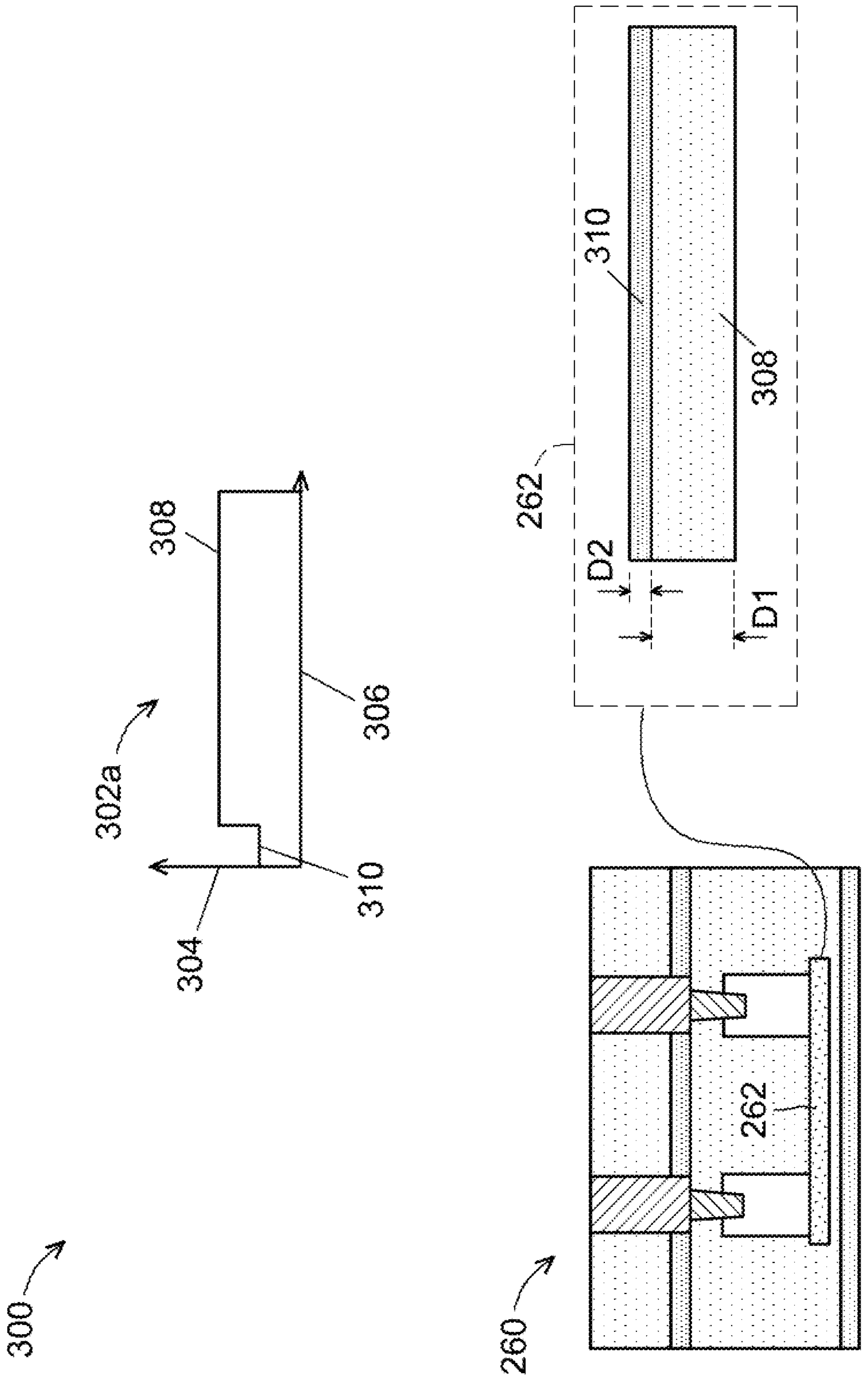
FIGS. 3A-3G are diagrams of example implementations of a graded resistive layer described herein.

FIG. 3A shows an example profile **302*a* of the graded resistive layer 262. As shown in the example profile 302*a*, the graded resistive layer 262 includes a bulk silicon chromium region 308 and a chromium-rich region 310. In FIG. 3A, the chromium-rich region 310 is above the bulk silicon chromium region 308**.

The bulk silicon chromium region 308 (e.g., a region having a uniform atomic composition of approximately 50% silicon and 50% chromium) may have a thickness D1 of less than approximately 200 angstroms (Å). If the thickness D1 is greater than approximately 200 Å, an efficiency and/or a cost of manufacturing the graded resistive layer 262 may increase. However, other values and ranges for the thickness D1 are within the scope of the present disclosure.

The chromium-rich region 310 (e.g., a region having an atomic composition of chromium that is greater than approximately 50%) may be a protective layer that reduces a likelihood of damage to the graded resistive layer 262 during one or more subsequent semiconductor manufacturing operations used to form the semiconductor resistor structure the semiconductor resistor structure the semiconductor resistor structure 260. For example, the chromium-rich region 310 may reduce a likelihood of damage to the graded resistive layer 262 during a deposition operation and/or an etching operation used to form the capping structures 264.

The chromium-rich region 310 may further have a thickness D2 that is included in a range of approximately 5 Å to approximately 50 Å. If the thickness D2 is less than approximately 5 Å, the chromium-rich region 310 may have intermittent growth and may cause non-uniformities and/or defects within the graded resistive layer 262. If the thickness D2 is greater than approximately 50 Å, a zero temperature coefficient of resistance of the semiconductor resistor structure 260 may increase to not satisfy a threshold. However, other values and ranges for the thickness D2 are within the scope of the present disclosure.

Figure 3B:
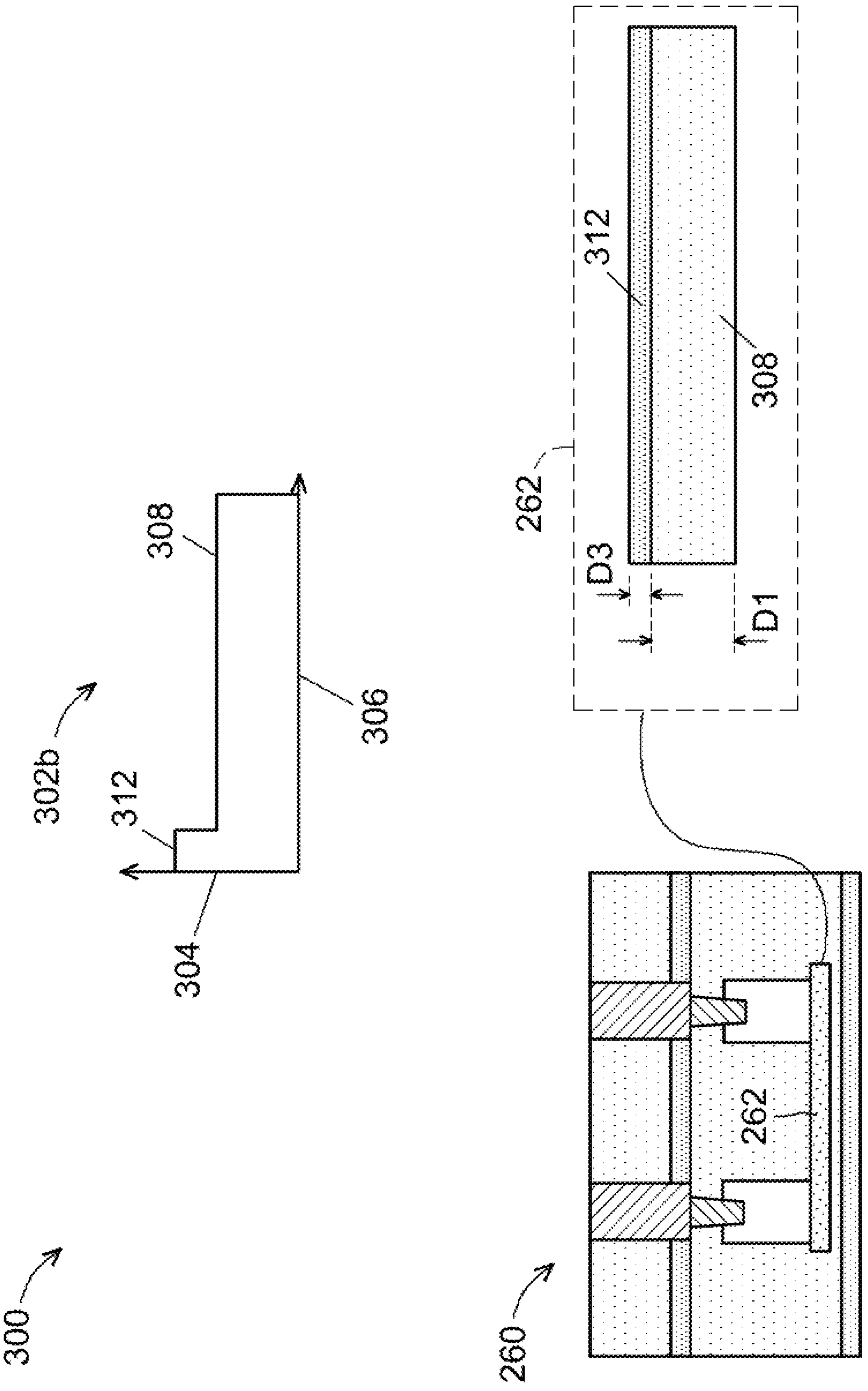

FIG. 3B shows an example profile 302*b* of the graded resistive layer 262. As shown in the example profile 302*b*, the graded resistive layer 262 includes the bulk silicon chromium region 308 and a silicon-rich region 312. In FIG. 3B, the silicon-rich region 312 is above the bulk silicon chromium region 308.

The bulk silicon chromium region 308 may have the thickness D1 as described above (e.g., a thickness of less than approximately 200 Å). The silicon-rich region 312 (e.g., a region having an atomic composition of silicon that is greater than approximately 50%) may perform as a passivation layer that reduces a likelihood of oxidation on, or within, the graded resistive layer 262 during one or more subsequent semiconductor manufacturing operations used to form the semiconductor resistor structure the semiconductor resistor structure 260. For example, the silicon-rich region 312 may reduce a likelihood of oxidation on, or within, the graded resistive layer 262 during a deposition operation that forms the dielectric layer 222.

The silicon-rich region 312 may further have a thickness D3 that is included in a range of approximately 5 Å to approximately 40 Å. If the thickness D3 is less than approximately 5 Å, the silicon-rich region 312 may have intermittent growth and may cause non-uniformities and/or defects within the graded resistive layer 262. If the thickness D3 is greater than approximately 40 Å, a zero temperature coefficient of resistance of the semiconductor resistor structure 260 may increase to not satisfy a threshold. However, other values and ranges for the thickness D3 are within the scope of the present disclosure.

Figure 3C:
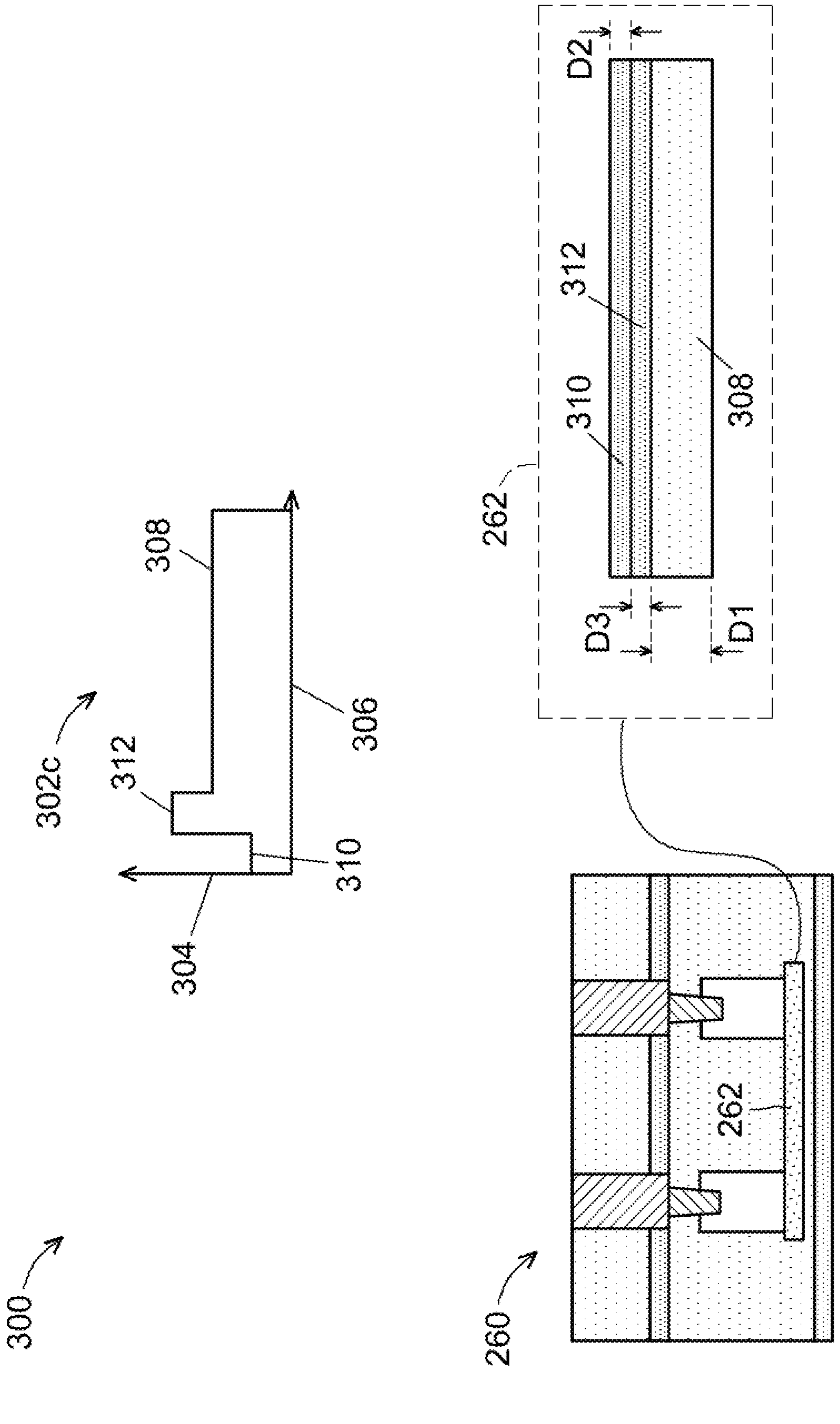

FIG. 3C shows an example profile 302*c* of the graded resistive layer 262. As shown in the example profile 302*c*, the graded resistive layer 262 includes the bulk silicon chromium region 308, the chromium-rich region 310, and the silicon-rich region 312. In FIG. 3C, the chromium-rich region 310 is above the bulk silicon chromium region 308. Further, in FIG. 3C, silicon-rich region 312 is above the bulk silicon chromium region 308 and below the chromium-rich region 310.

As described above, the bulk silicon chromium region 308 may have the thickness D1 (e.g., a thickness of less than approximately 200 Å). Further, and as described above, the chromium-rich region 310 may have the thickness D2 (e.g., a thickness that is included in a range of approximately 5 Å to approximately 50 Å). Such a thickness may reduce a likelihood of damage to the graded resistive layer 262 during one or more subsequent semiconductor manufacturing operations. Further, and as described above, the silicon-rich region 312 may have the thickness D3 (e.g., a thickness that is included in a range of approximately 5 Å to approximately 40 Å). Such a thickness may reduce a likelihood of oxidation on, or within, the graded resistive layer 262 during one or more subsequent semiconductor manufacturing operations.

Figure 3D:
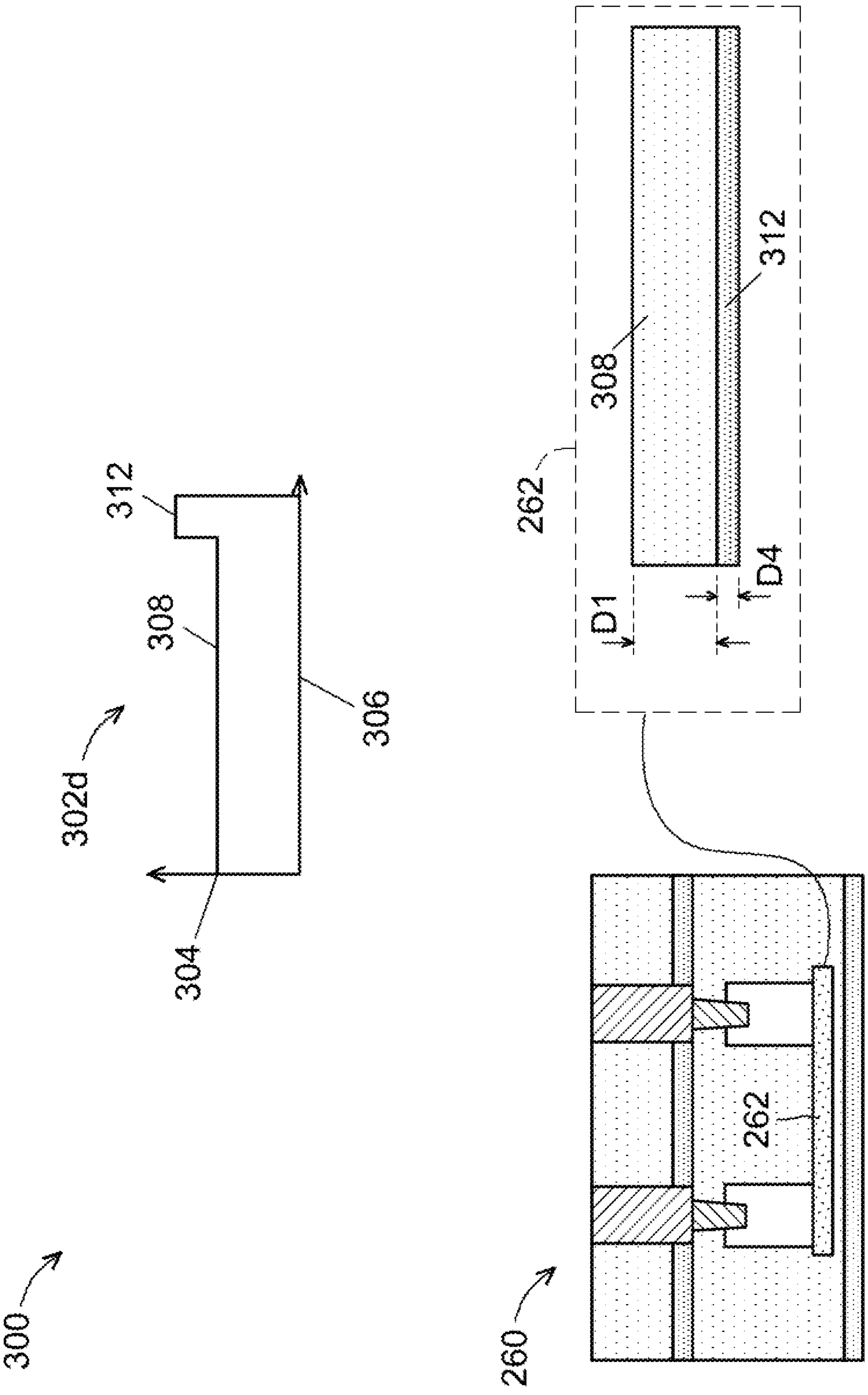

FIG. 3D shows an example profile 302*d* of the graded resistive layer 262. As shown in the example profile 302*d*, the graded resistive layer 262 includes the bulk silicon chromium region 308 and the silicon-rich region 312. In FIG. 3D, the silicon-rich region 312 is below the bulk silicon chromium region 308.

The bulk silicon chromium region 308 may have the thickness D1 as described above (e.g., a thickness of less than approximately 200 Å). During deposition of the bulk silicon chromium region 308, the silicon-rich region 312 may prevent oxygenation within the bulk silicon chromium region 308 to reduce a likelihood of delamination of the graded resistive layer 262 from an underlying layer (e.g., the dielectric layer 222).

The silicon-rich region 312 may further have a thickness D4 that is included in a range of approximately 5 Å to approximately 100 Å. If the thickness D4 is less than approximately 5 Å, the silicon-rich region 312 may have intermittent growth and may cause non-uniformities and/or defects within the graded resistive layer 262. If the thickness D4 is greater than approximately 100 Å, a zero temperature coefficient of resistance of the semiconductor resistor structure 260 may increase to not satisfy a threshold. However, other values and ranges for the thickness D4 are within the scope of the present disclosure.

Figure 3E:
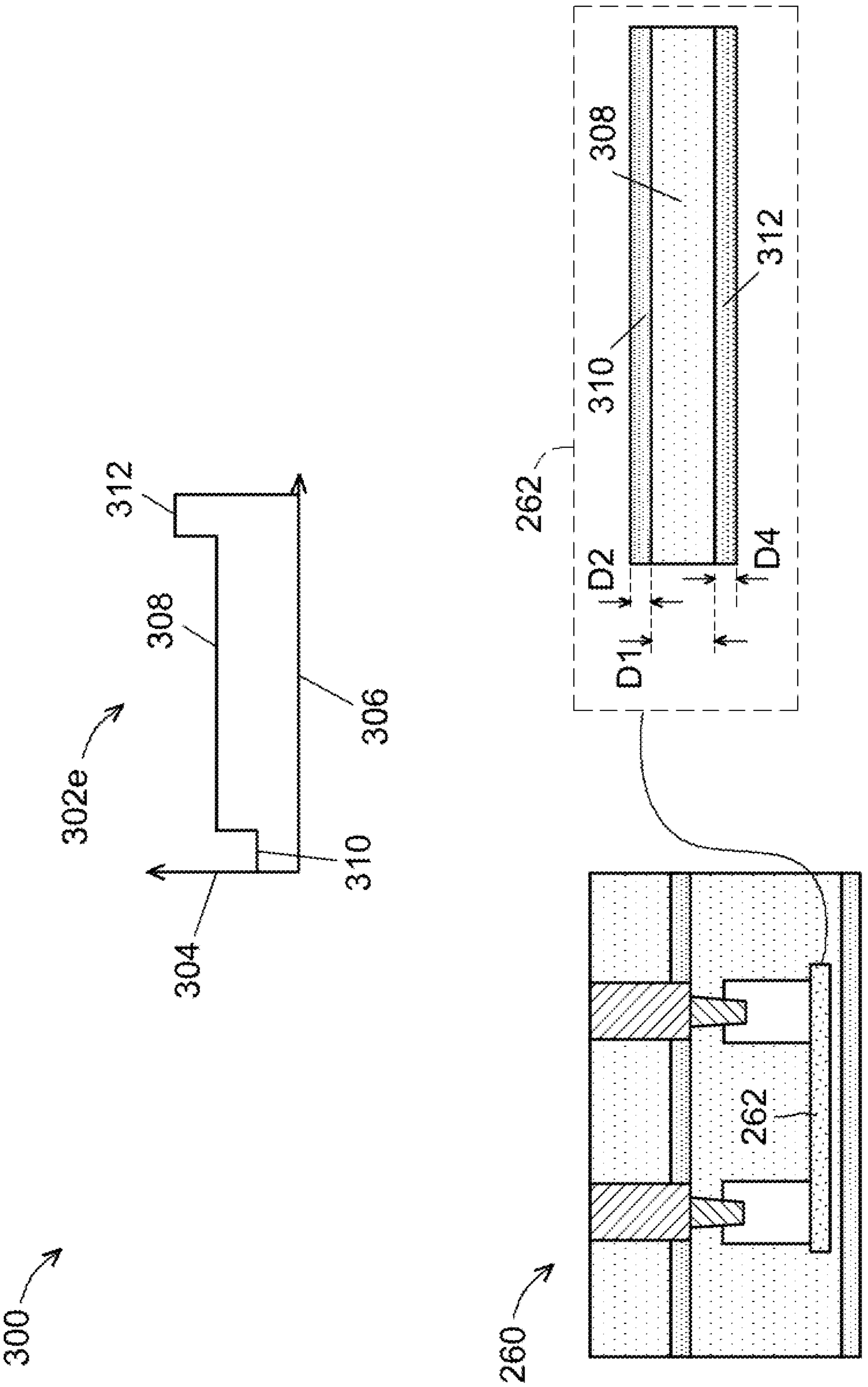

FIG. 3E shows an example profile 302*e* of the graded resistive layer 262. As shown in the example profile 302*c*, the graded resistive layer 262 includes the bulk silicon chromium region 308, the chromium-rich region 310, and the silicon-rich region 312. In FIG. 3E, the silicon-rich region 312 is below the bulk silicon chromium region 308 and the chromium-rich region 310 is above the bulk silicon chromium region 308.

As described above, the bulk silicon chromium region 308 may have the thickness D1 (e.g., a thickness of less than approximately 200 Å). Further, and as described above, the chromium-rich region 310 may have the thickness D2 (e.g., a thickness that is included in a range of approximately 5 Å to approximately 50 Å). Such a thickness may reduce a likelihood of damage to the graded resistive layer 262 during one or more subsequent semiconductor manufacturing operations. Further, and as described above, the silicon-rich region 312 may have the thickness D4 (e.g., a thickness that is included in a range of approximately 5 Å to approximately 100 Å). Such a thickness may reduce a likelihood of delamination of the graded resistive layer 262.

Figure 3F:
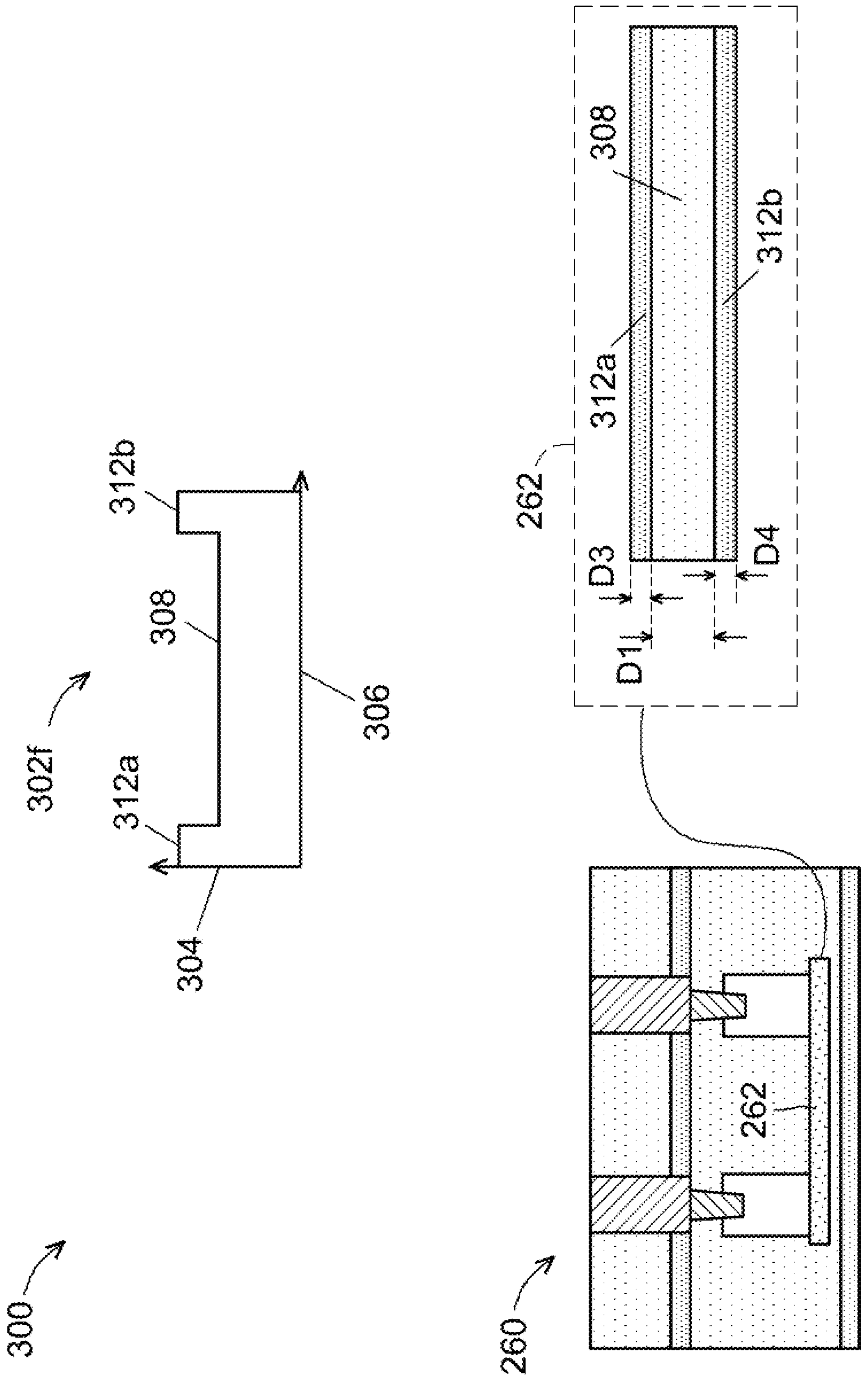

FIG. 3F shows an example profile 302*f* of the graded resistive layer 262. As shown in the example profile 302*e*, the graded resistive layer 262 includes the bulk silicon chromium region 308, the silicon-rich region 312*a*, and the silicon-rich region 312*b*. In FIG. 3F, the silicon-rich region 312*a* is above the bulk silicon chromium region 308 and the silicon-rich region 312*b* is below the bulk silicon chromium region 308.

As described above, the bulk silicon chromium region 308 may have the thickness D1 (e.g., a thickness of less than approximately 200 Å). Further, and as described above, the silicon-rich region 312*a* may have the thickness D3 (e.g., a thickness that is included in a range of approximately 5 Å to approximately 40 Å). Such a thickness may reduce a likelihood of damage to the graded resistive layer 262 during one or more subsequent semiconductor manufacturing operations. Further, and as described above, the silicon-rich region 312*b* may have the thickness D4 (e.g., a thickness that is included in a range of approximately 5 Å to approximately 100 Å). Such a thickness may reduce a likelihood of delamination of the graded resistive layer 262.

Figure 3G:
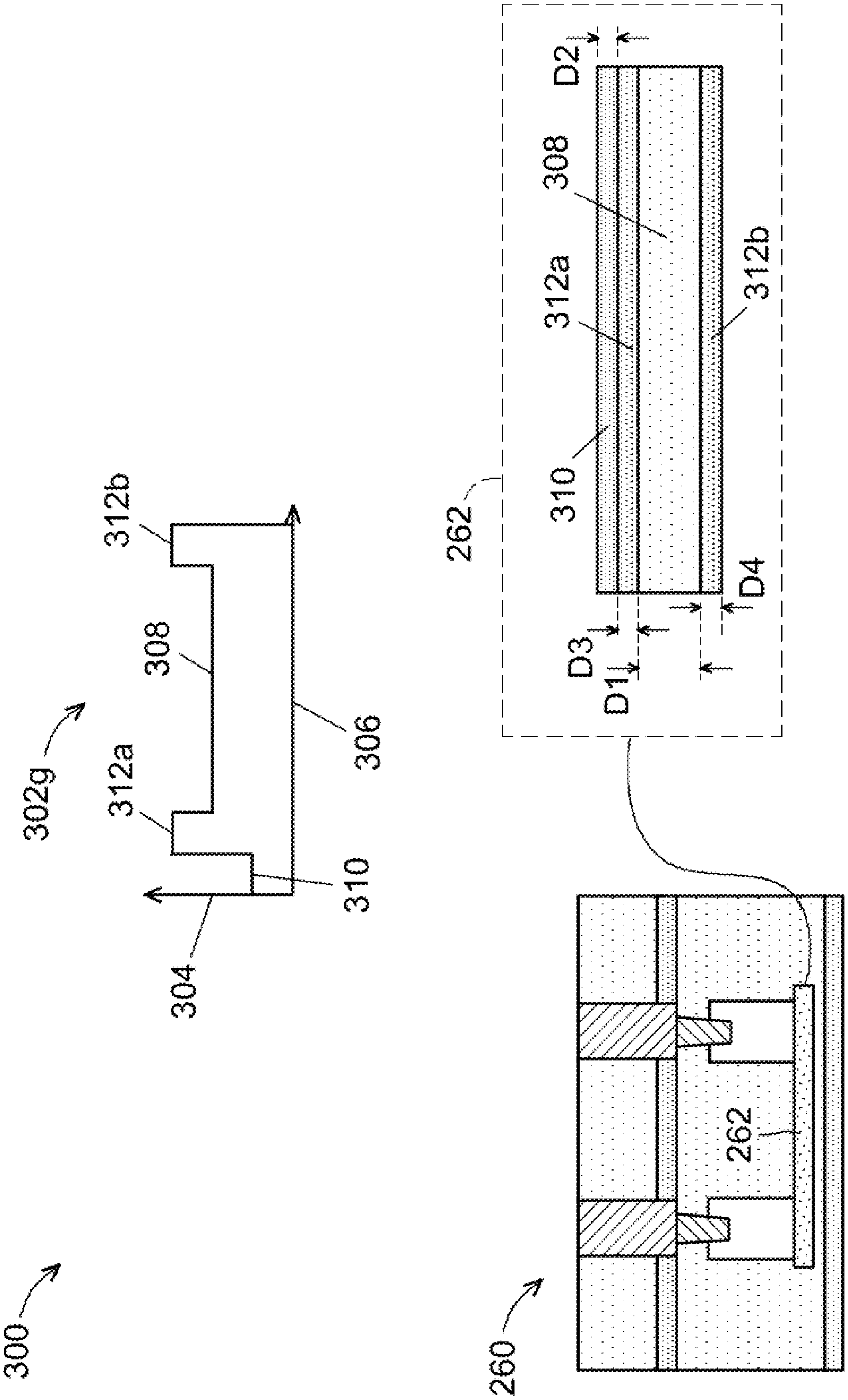

FIG. 3G shows an example profile 302*g* of the graded resistive layer 262. As shown in the example profile 302*c*, the graded resistive layer 262 includes the bulk silicon chromium region 308, the chromium-rich region 310, the silicon-rich region 312*a*, and the silicon-rich region 312*b*. In FIG. 3G, the chromium-rich region 310 is above the bulk silicon chromium region 308, the silicon-rich region 312*a* is above the bulk silicon chromium region 308 and below the chromium-rich region 310, and the silicon-rich region 312*b* is below the bulk silicon chromium region 308.

As described above, the bulk silicon chromium region 308 may have the thickness D1 (e.g., a thickness of less than approximately 200 Å). Further, and as described above, the chromium-rich region 310 may have the thickness D2 (e.g., a thickness that is included in a range of approximately 5 Å to approximately 50 Å). Such a thickness may reduce a likelihood of damage to the graded resistive layer 262 during one or more subsequent semiconductor manufacturing operations. Further, and as described above, the silicon-rich region 312*a* may have the thickness D3 (e.g., a thickness that is included in a range of approximately 5 Å to approximately 40 Å). Such a thickness may reduce a likelihood of oxidation on, or within, the graded resistive layer 262 during one or more subsequent semiconductor manufacturing operations. Further, and as described above, the silicon-rich region 312*b* may have the thickness D4 (e.g., a thickness that is included in a range of approximately 5 Å to approximately 100 Å). Such a thickness may reduce a likelihood of delamination of the graded resistive layer 262.

As described in connection with FIGS. 2 and 3A-3G, some implementations herein provide a semiconductor resistor structure (e.g., the semiconductor resistor structure 260) that includes an interconnect structure (e.g., one or more of the vias 266). The semiconductor resistor structure includes a capping structure (e.g., one or more of the capping structures 264) connected to the interconnect structure below the interconnect structure. The semiconductor resistor structure includes a graded resistive layer (e.g., the graded resistive layer 262) connected to the capping structure below the capping structure. The graded resistive layer includes a bulk silicon chromium region (e.g., the bulk silicon chromium region 308) and a chromium-rich region (e.g., the chromium-rich region 310).

Additionally, or alternatively, a semiconductor resistor structure (e.g., the semiconductor resistor structure 260) includes an interconnect structure (e.g., one or more of the vias 266). The semiconductor resistor structure includes a capping structure (e.g., one or more of the capping structures 264) connected to the interconnect structure below the interconnect structure. The semiconductor resistor structure includes a graded resistive layer (e.g., the graded resistive layer 262) connected to the capping structure below the capping structure. The graded resistive layer includes a bulk silicon chromium region (e.g., the bulk silicon chromium region 308) and a silicon-rich region (e.g., the silicon-rich region 312).

The graded resistive layer may compensate for semiconductor manufacturing processes (e.g., etching, oxidation, thermal annealing) that may lead to film damage, thinning, crystallization, or composition drift of the graded resistive layer to enlarge process windows for fabricating the semiconductor resistor structure. Additionally, or alternatively, an enlarged process window may improve a performance of the semiconductor resistor structure the semiconductor resistor structure (e.g., a resistance and/or an impedance uniformity) relative to another semiconductor resistor structure fabricated using a uniform layer of a silicon chromium material.

In this way, a performance (e.g., a reliability margin) of a semiconductor device (e.g., the semiconductor device 200) including the semiconductor resistor structure is improved. Improving the performance of the semiconductor device may increase a manufacturing yield, of the semiconductor device, to a particular performance threshold, thereby reducing an amount of resources required to support a market that consumes a volume of the semiconductor device satisfying the particular performance threshold (e.g., semiconductor processing tools, labor, raw material, and/or computing resources).

As indicated above, FIGS. 3A-3G are provided as examples. Other examples may differ from what is described with regard to FIGS. 3A-3G.

Figure 4:
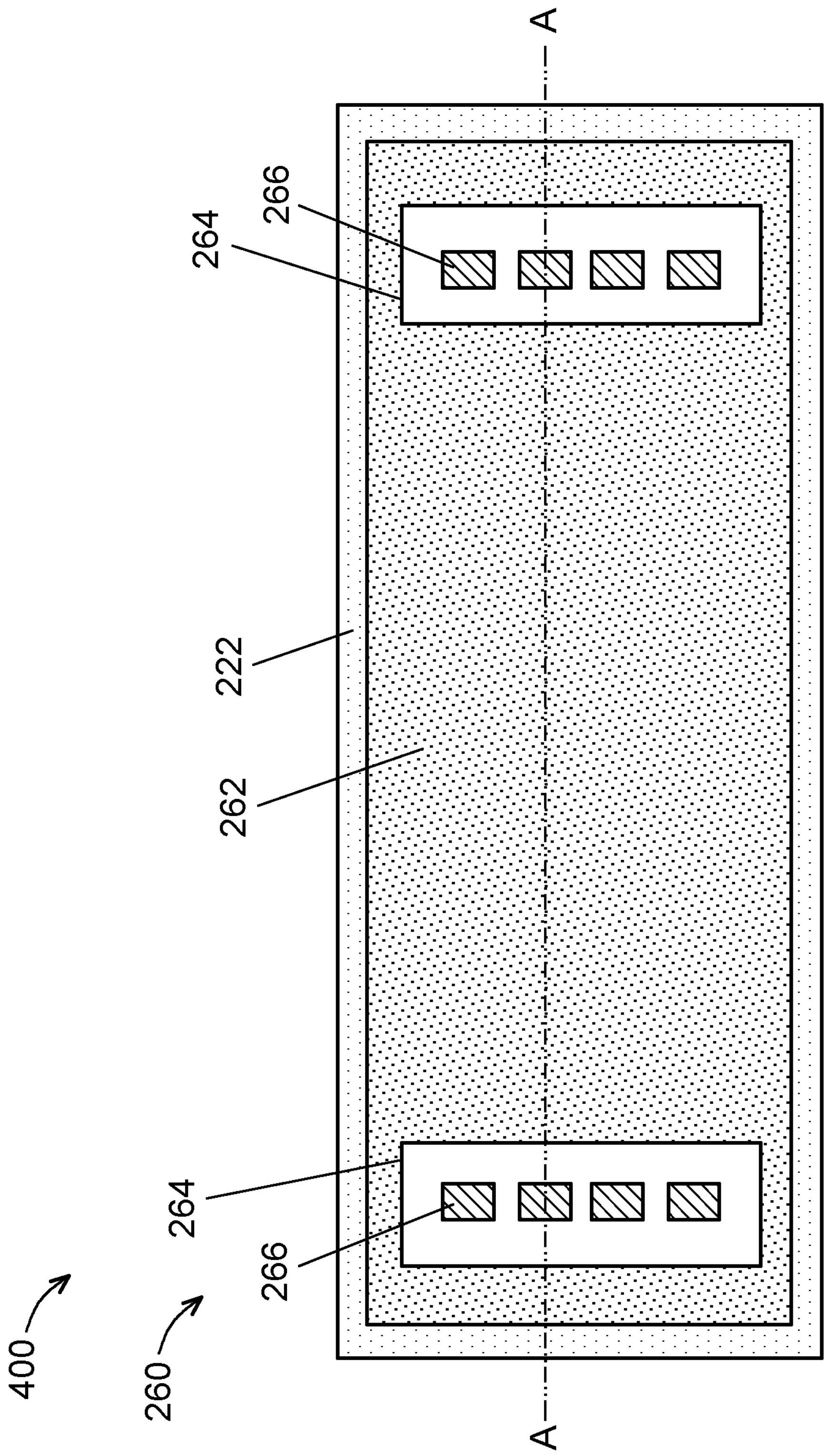
FIG. 4 is a diagram of an example implementation of an example semiconductor resistor structurer described herein.

FIG. 4 is a diagram of an example implementation of an example semiconductor resistor structure 260 described herein. FIG. 4 illustrates a top-down view of the semiconductor resistor structure 260. FIG. 4 further illustrates a reference cross-section A-A that is used in later figures, including FIGS. 5A-5J. Cross-section A-A is in a plane along the graded resistive layer 262 and includes the capping structures 264. Some structures/layers are illustrated in dashed lines as an indication that those structures/layers are located under one or more other structures/layers in the semiconductor resistor structure 260. Moreover, the dielectric layer 222 is shown as being under the graded resistive layer 262 only for purposes of clarity in illustrating the structures/layers of the semiconductor resistor structure 260. It is to be understood that the dielectric layer 222 covers the structures/layers of the semiconductor resistor structure 260. As shown in FIG. 4, the capping structures 264 may be located at opposing ends of the graded resistive layer 262. A plurality of vias 266 may penetrate into a portion of the capping structures 264.

As indicated above, FIG. 4 is provided as an example. Other examples may differ from what is described with regard to FIG. 4.

FIGS. 5A-5J are diagrams of an example series of semiconductor manufacturing operations 500 used to form a semiconductor resistor structure (e.g., the semiconductor resistor structure 260) described herein. In some implementations, one or more of the series of semiconductor manufacturing operations 500 may be performed by one or more of the semiconductor processing tools 102-112. In some implementations, one or more of the series of semiconductor manufacturing operations 500 may be performed another semiconductor processing tool.

Figure 5A:
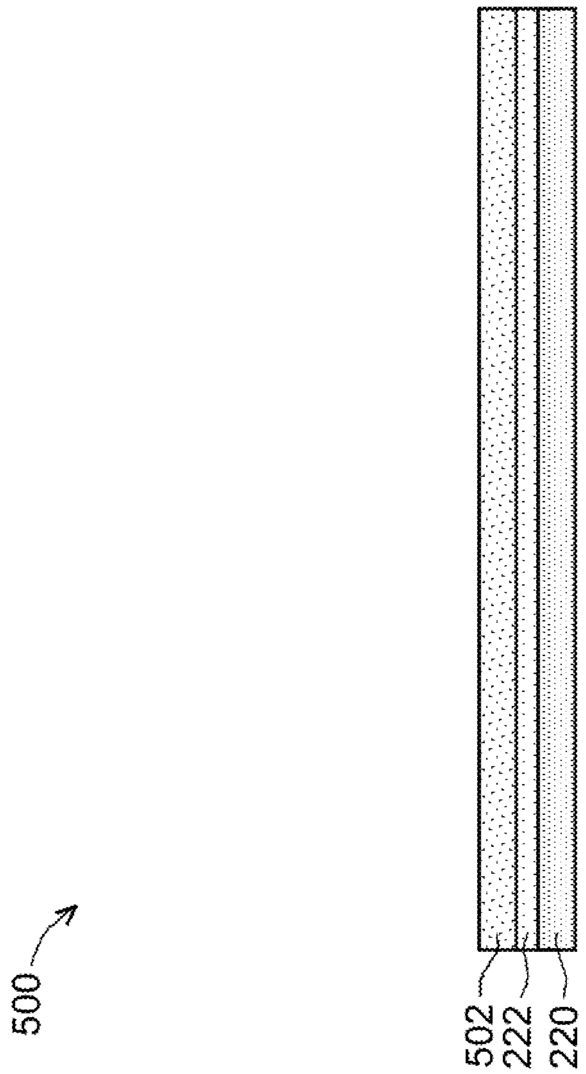
FIGS. 5A-5J are diagrams of an example series of semiconductor manufacturing operations used to form a semiconductor resistor structure described herein.

Turning to FIG. 5A, the series of semiconductor manufacturing operations 500 may be performed in a BEOL region of the semiconductor device 200. For example, a portion of the dielectric layer 222 may be formed over and/or on the ESL 220, and a graded silicon chromium layer 502 may be formed over and/or on the portion of the dielectric layer 222, among other examples.

The deposition tool 102 may deposit the ESL 220 and/or the portion of the dielectric layer 222 using an epitaxy technique, a CVD technique, a PVD technique, an ALD technique, another deposition technique described above in connection with FIG. 1, and/or a deposition technique other than as described above in connection with FIG. 1. The deposition tool 102 may deposit the graded silicon chromium layer 502 using an ALD technique, a PVD technique, another technique described above in connection with FIGS. 1 and 3A-3G, and/or a deposition technique other than as described above in connection with FIGS. 1 and 3A-3G described in connection with FIG. 1 and FIGS. 3A-3G. In some implementations, the planarization tool 110 may perform a CMP operation to planarize the ESL 220, the portion of the dielectric layer 206, and/or the graded silicon chromium layer 502.

Figure 5B:
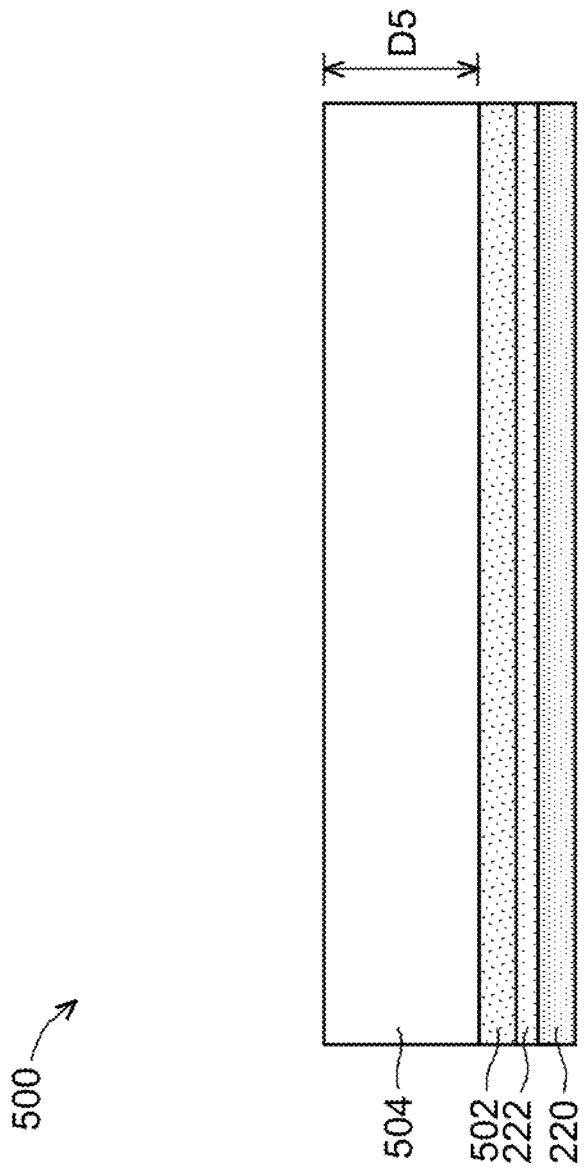

In FIG. 5B, the deposition tool 102 may deposit a capping layer 504 (e.g., a conductive layer) using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the capping layer 504.

After deposition and/or planarization, the capping layer 504 may have a thickness D5 that is included in a range of approximately 50 Å to approximately 1000 Å. If the thickness D5 is less than approximately 50 Å, the capping layer 504 may be ineffective as an etch stop for cavities used for subsequent formation of interconnect structures of a semiconductor resistor structure (e.g., the semiconductor resistor structure 260). If the thickness D5 is greater than approximately 1000 Å, a parasitic resistance within the semiconductor resistor structure may be increased and not satisfy a threshold. However, other values and ranges for the thickness D5 are within the scope of the present disclosure.

Figure 5C:
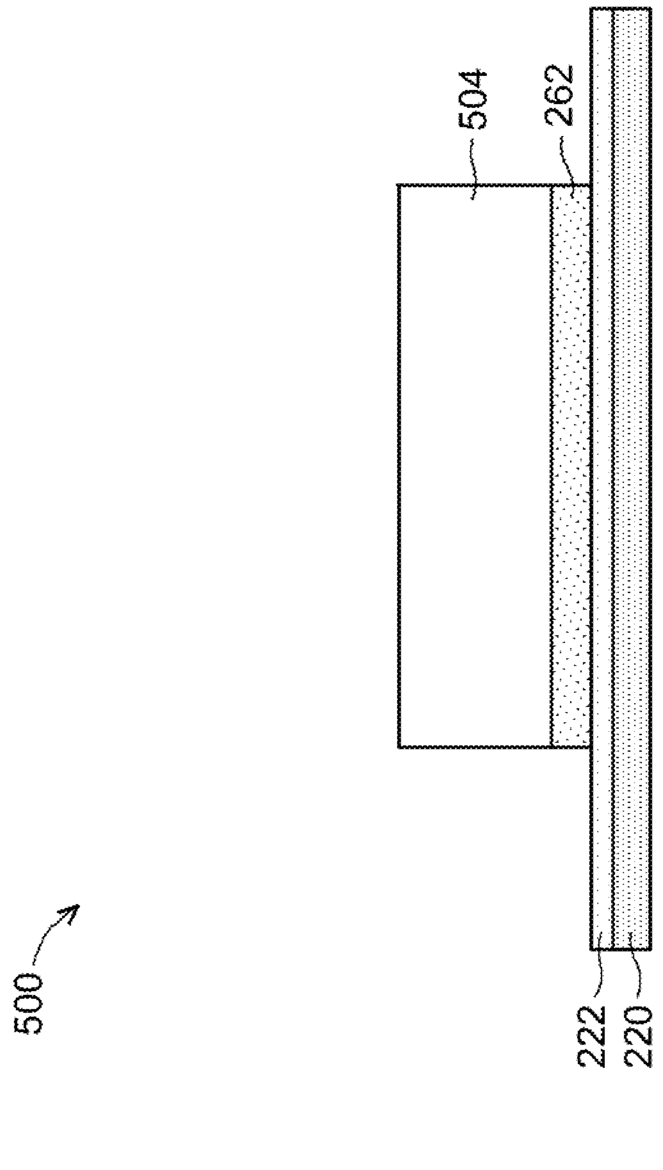

As shown in FIG. 5C, portions of the of the graded silicon chromium layer 502 and the capping layer 504 may be removed to form the graded resistive layer 262. In some implementations, a pattern in a photoresist layer is used to remove the portions of the graded silicon chromium layer 502 and the portions of the capping layer 504. In these implementations, the deposition tool 102 forms the photoresist layer over the capping layer 504. The exposure tool 104 exposes the photoresist layer to a radiation source to pattern the photoresist layer. The developer tool 106 develops and removes portions of the photoresist layer to expose the pattern. The etch tool 108 etches through the capping layer 504 and through the graded silicon chromium layer 502 to form the graded resistive layer 262. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5D:
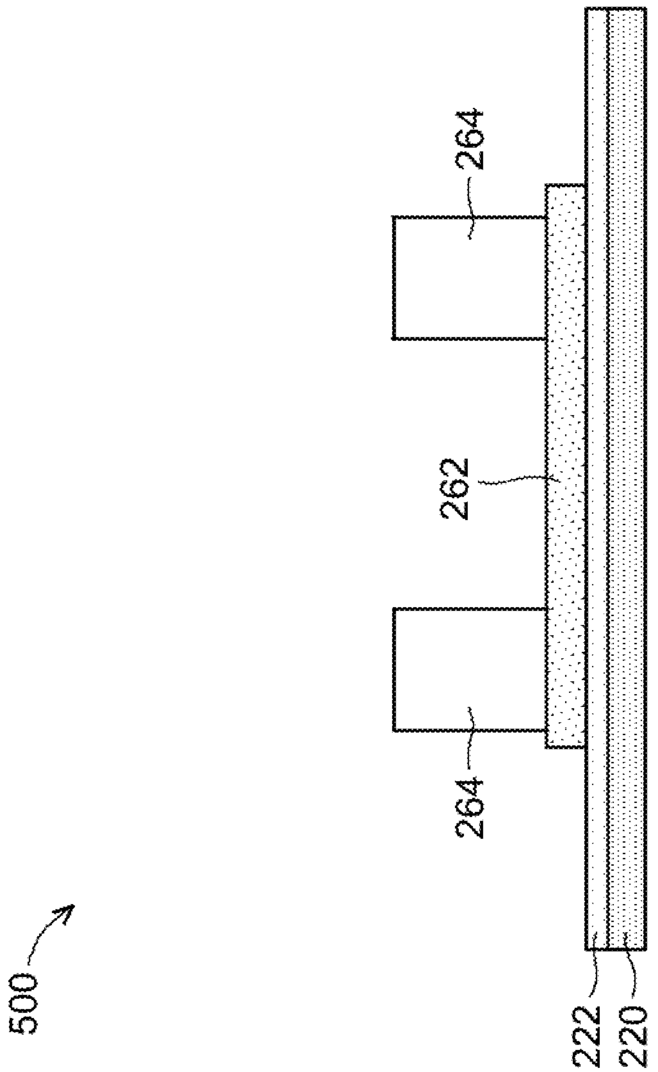

Turning to FIG. 5D, portions of the capping layer 504 are removed. Remaining portions of the capping layer 504 correspond to the capping structures 264. In some implementations, a pattern in a photoresist layer is used to remove the portions of the capping layer 504. In these implementations, the deposition tool 102 forms the photoresist layer over the capping layer 504. The exposure tool 104 exposes the photoresist layer to a radiation source to pattern the photoresist layer. The developer tool 106 develops and removes portions of the photoresist layer to expose the pattern. The etch tool 108 etches through the capping layer 504 to form the capping structures 264. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5E:
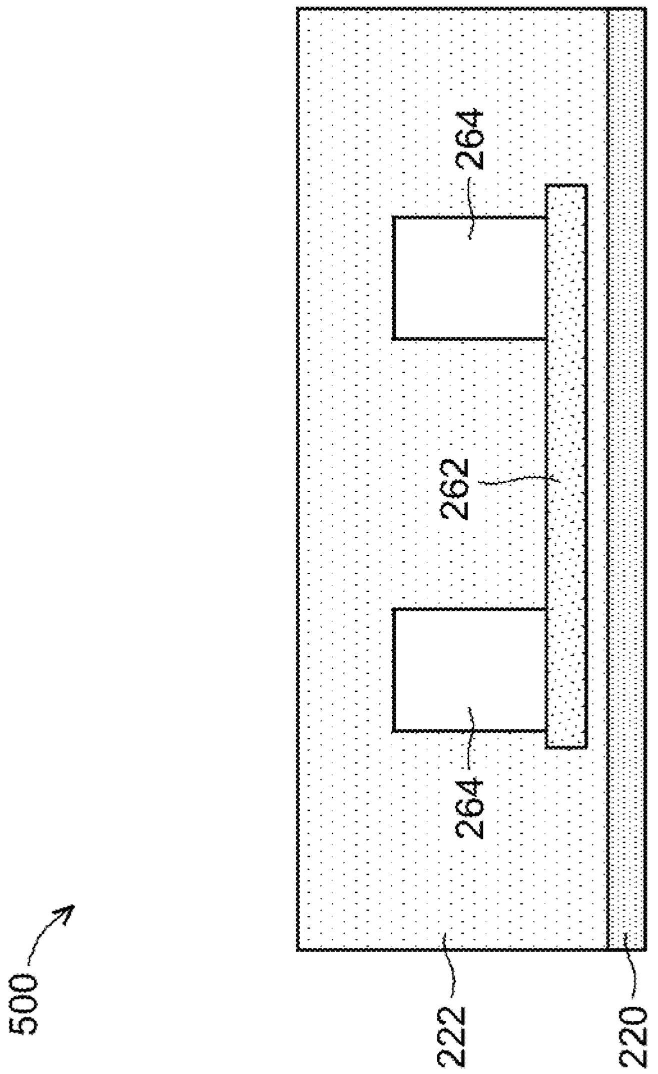

As shown in FIG. 5E, an additional portion of the dielectric layer 222 may be formed over, on, and/or around the capping structures 264. The deposition tool 102 may deposit the additional portion of the dielectric layer 222 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the dielectric layer 222 after the additional portion of the dielectric layer 222 is deposited.

Figure 5F:
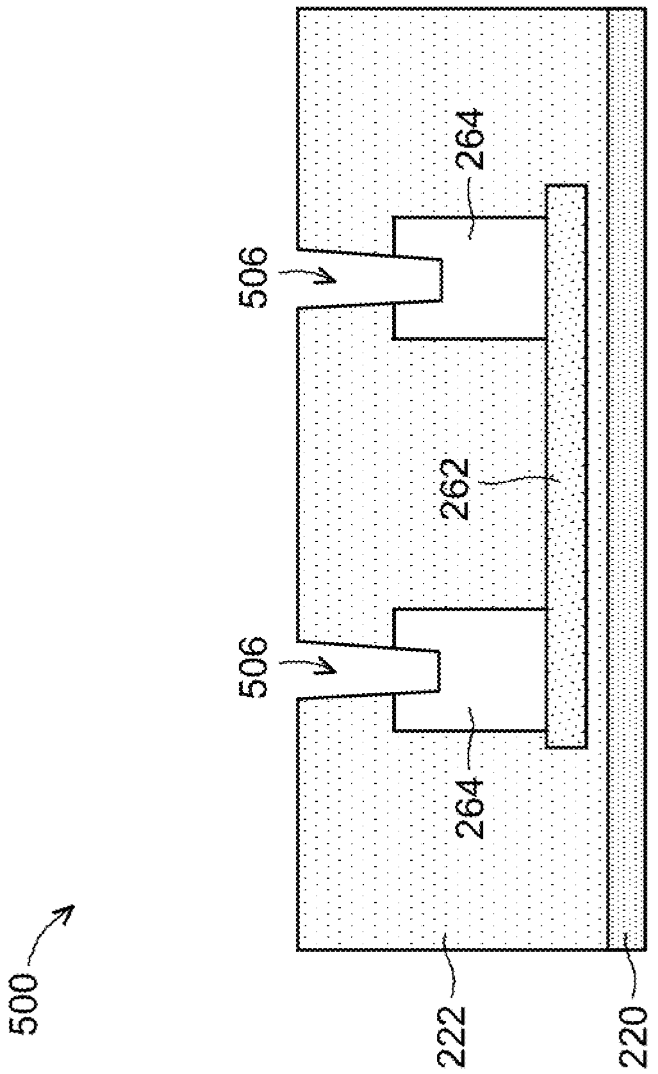

As shown in FIG. 5F, recesses 506 formed in the dielectric layer 222 and into a portion of the capping structures 264. In these implementations, the deposition tool 102 forms the photoresist layer over the dielectric layer 222. The exposure tool 104 exposes the photoresist layer to a radiation source to pattern the photoresist layer. The developer tool 106 develops and removes portions of the photoresist layer to expose the pattern. The etch tool 108 etches through the dielectric layer 222 and into a portion of the capping structures 264 to respectively form the recesses 506. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5G:
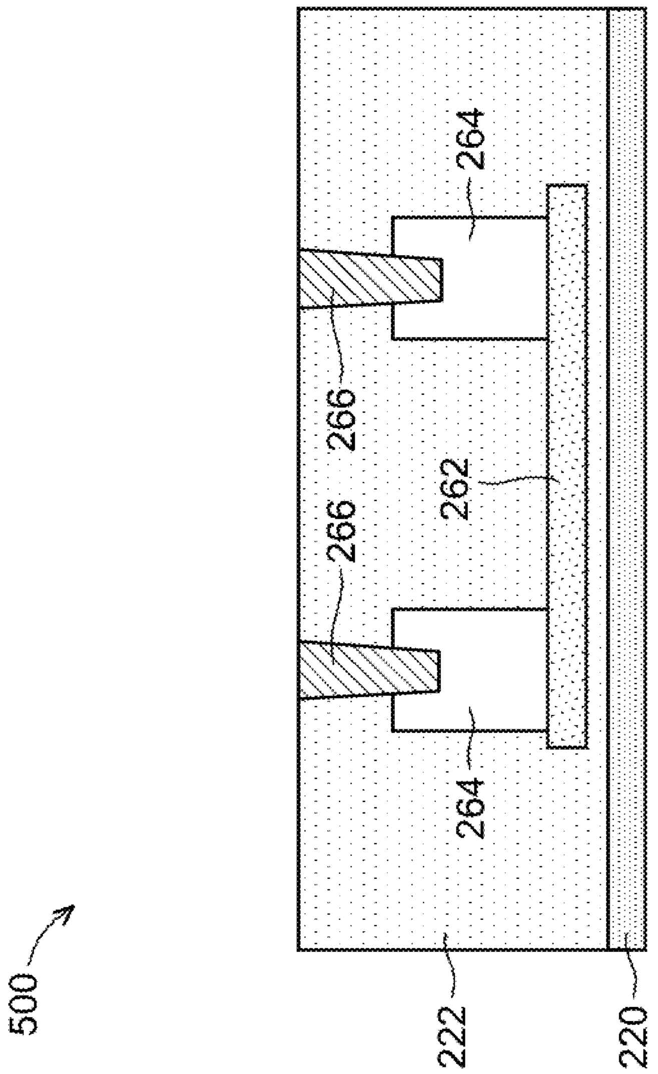

As shown in FIG. 5G, the recesses 506 may be filled with one or more conductive materials to respectively form the vias 266 in the recesses 506 The deposition tool 102 and/or the plating tool 112 may deposit the vias 266 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the vias 266.

Figure 5H:
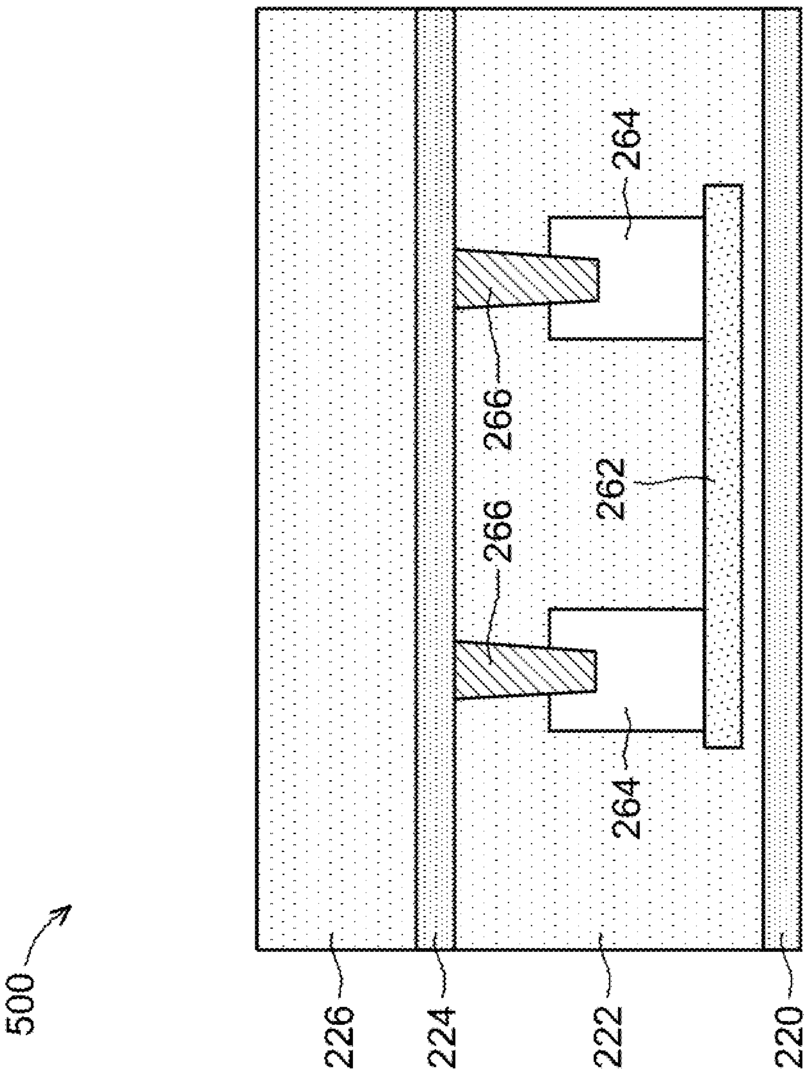

As shown in FIG. 5H, additional dielectric layers of the BEOL region may be formed. For example, the ESL 224 may be formed over the vias 266 and over and/or on the dielectric layer 222. As another example, the dielectric layer 226 may be formed over and/or on the ESL 224. The deposition tool 102 may deposit the ESL 224 and/or the dielectric layer 226 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the ESL 224 and/or the dielectric layer 226 after the ESL 224 and/or the dielectric layer 226 is deposited.

Figure 5I:
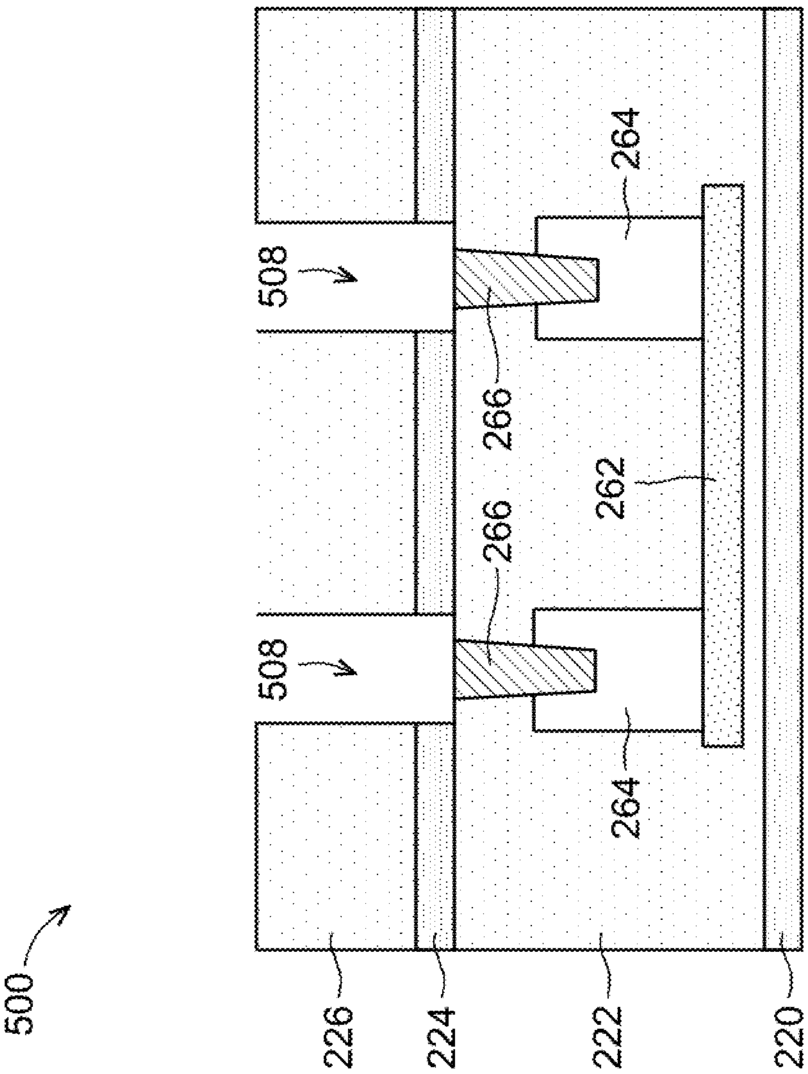

As shown in FIG. 5I, recesses 508 may be formed through the dielectric layer 226 and through the ESL 224 to expose top surfaces of the vias 266. In these implementations, the deposition tool 102 forms the photoresist layer over the dielectric layer 226. The exposure tool 104 exposes the photoresist layer to a radiation source to pattern the photoresist layer. The developer tool 106 develops and removes portions of the photoresist layer to expose the pattern. The etch tool 108 etches through the dielectric layer 226 and through the ESL 224 to form the recesses 508. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique).

Figure 5J:
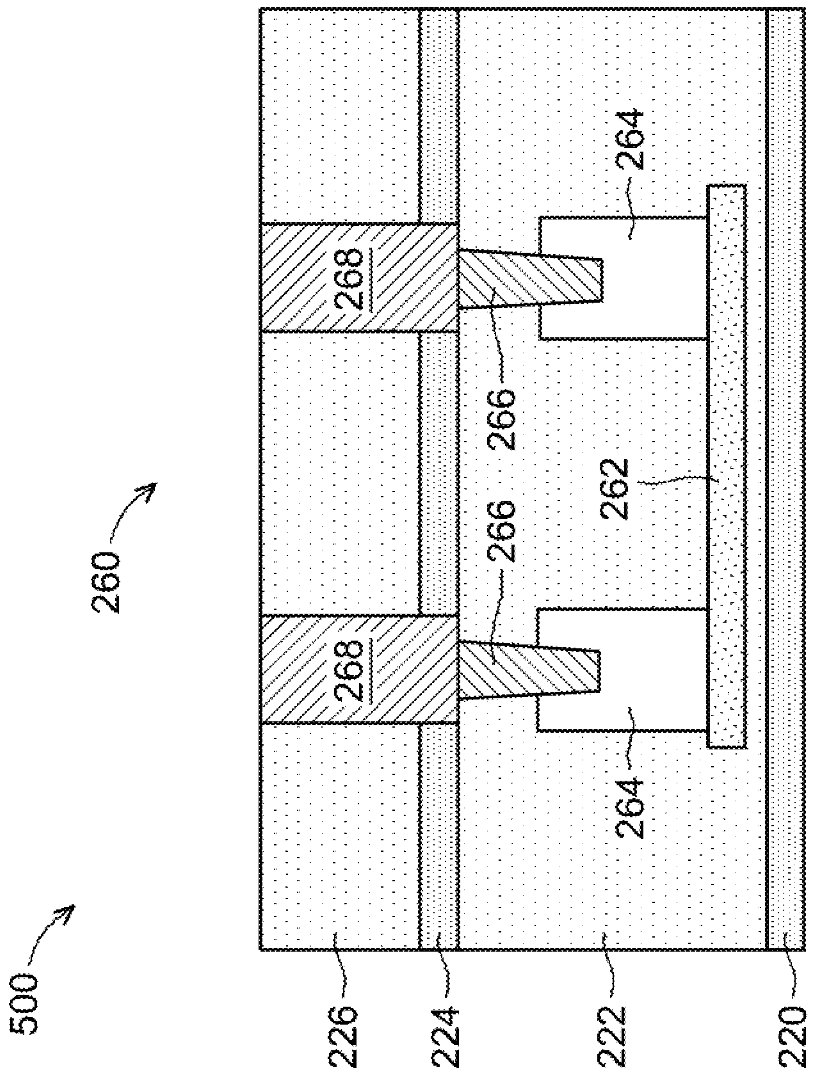

As shown in FIG. 5J, the recesses 508 may be filled with one or more conductive materials to respectively form the conductive structures 268 in the recesses 508. The deposition tool 102 and/or the plating tool 112 may deposit the conductive structures 268 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the conductive structures 268.

As indicated above, FIGS. 5A-5J are provided as an example. Other examples may differ from what is described with regard to FIGS. 5A-5J.

Figure 6:
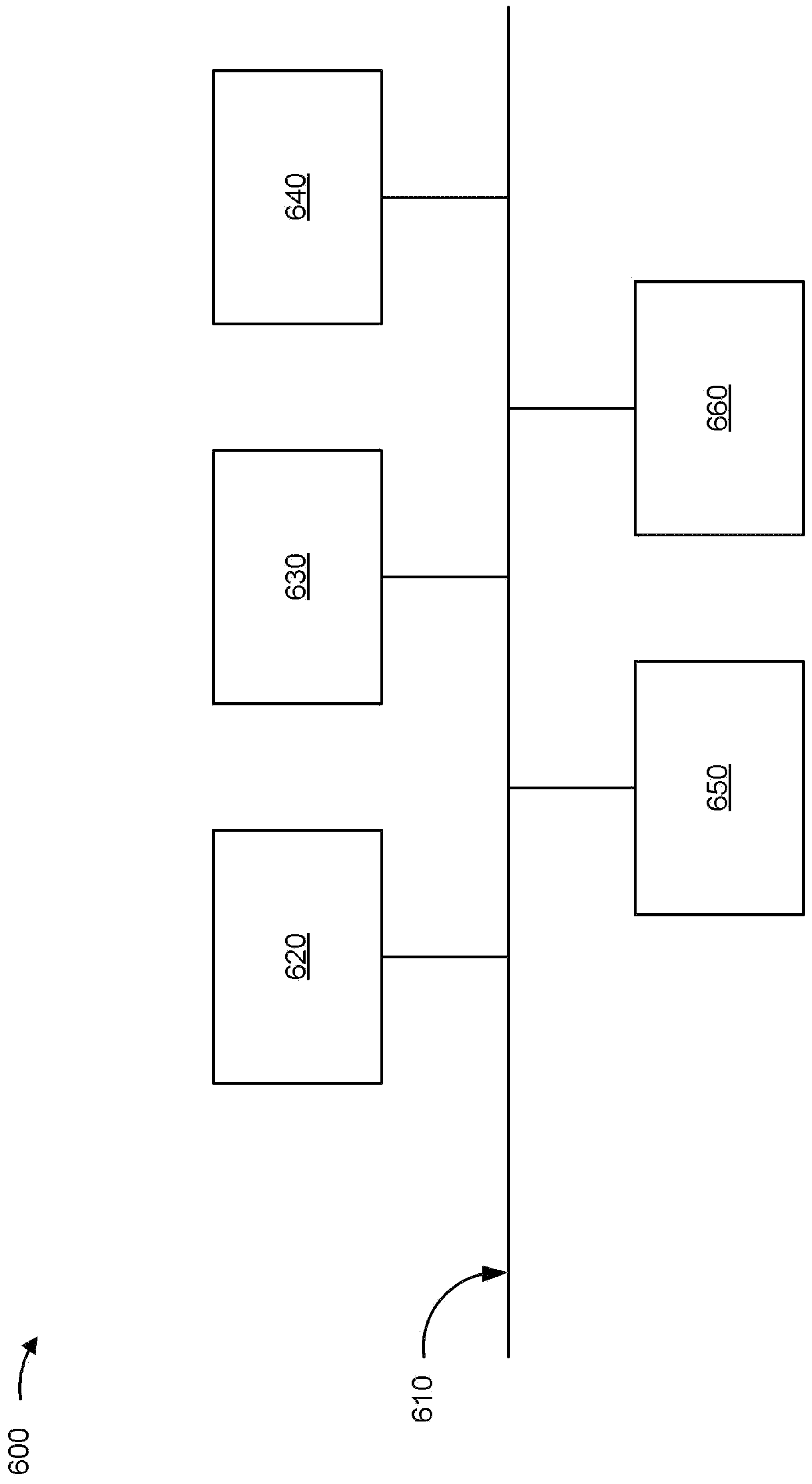
FIG. 6 is a diagram of example components of a device associated with forming a resistor structure having a graded resistive layer.

FIG. 6 is a diagram of example components of a device 600 associated with forming a semiconductor resistor structure with a graded resistive layer. In some implementations, one or more of the semiconductor processing tools 102-112 and/or the wafer/die transport tool 114 may include one or more devices 600 and/or one or more components of the device 600. Further, one or more of the semiconductor processing tools 102-112 and/or the wafer/die transport tool 114 may include one or more devices 600 and/or one or more components of the device 600. As shown in FIG. 6, the device 600 may include a bus 610, a processor 620, a memory 630, an input component 640, an output component 650, and/or a communication component 660.

The bus 610 may include one or more components that enable wired and/or wireless communication among the components of the device 600. The bus 610 may couple together two or more components of FIG. 6, such as via operative coupling, communicative coupling, electronic coupling, and/or electric coupling. For example, the bus 610 may include an electrical connection (e.g., a wire, a trace, and/or a lead) and/or a wireless bus. The processor 620 may include a central processing unit, a graphics processing unit, a microprocessor, a controller, a microcontroller, a digital signal processor, a field-programmable gate array, an application-specific integrated circuit, and/or another type of processing component. The processor 620 may be implemented in hardware, firmware, or a combination of hardware and software. In some implementations, the processor 620 may include one or more processors capable of being programmed to perform one or more operations or processes described elsewhere herein.

The memory 630 may include volatile and/or nonvolatile memory. For example, the memory 630 may include random access memory (RAM), read only memory (ROM), a hard disk drive, and/or another type of memory (e.g., a flash memory, a magnetic memory, and/or an optical memory). The memory 630 may include internal memory (e.g., RAM, ROM, or a hard disk drive) and/or removable memory (e.g., removable via a universal serial bus connection). The memory 630 may be a non-transitory computer-readable medium. The memory 630 may store information, one or more instructions, and/or software (e.g., one or more software applications) related to the operation of the device 600. In some implementations, the memory 630 may include one or more memories that are coupled (e.g., communicatively coupled) to one or more processors (e.g., processor 620), such as via the bus 610. Communicative coupling between a processor 620 and a memory 630 may enable the processor 620 to read and/or process information stored in the memory 630 and/or to store information in the memory 630.

The input component 640 may enable the device 600 to receive input, such as user input and/or sensed input. For example, the input component 640 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 650 may enable the device 600 to provide output, such as via a display, a speaker, and/or a light-emitting diode. The communication component 660 may enable the device 600 to communicate with other devices via a wired connection and/or a wireless connection. For example, the communication component 660 may include a receiver, a transmitter, a transceiver, a modem, a network interface card, and/or an antenna.

The device 600 may perform one or more operations or processes described herein. For example, a non-transitory computer-readable medium (e.g., memory 630) may store a set of instructions (e.g., one or more instructions or code) for execution by the processor 620. The processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry may be used instead of or in combination with the instructions to perform one or more operations or processes described herein. Additionally, or alternatively, the processor 620 may be configured to perform one or more operations or processes described herein. Thus, implementations described herein are not limited to any specific combination of hardware circuitry and software.

The number and arrangement of components shown in FIG. 6 are provided as an example. The device 600 may include additional components, fewer components, different components, or differently arranged components than those shown in FIG. 6. Additionally, or alternatively, a set of components (e.g., one or more components) of the device 600 may perform one or more functions described as being performed by another set of components of the device 600.

Figure 7:
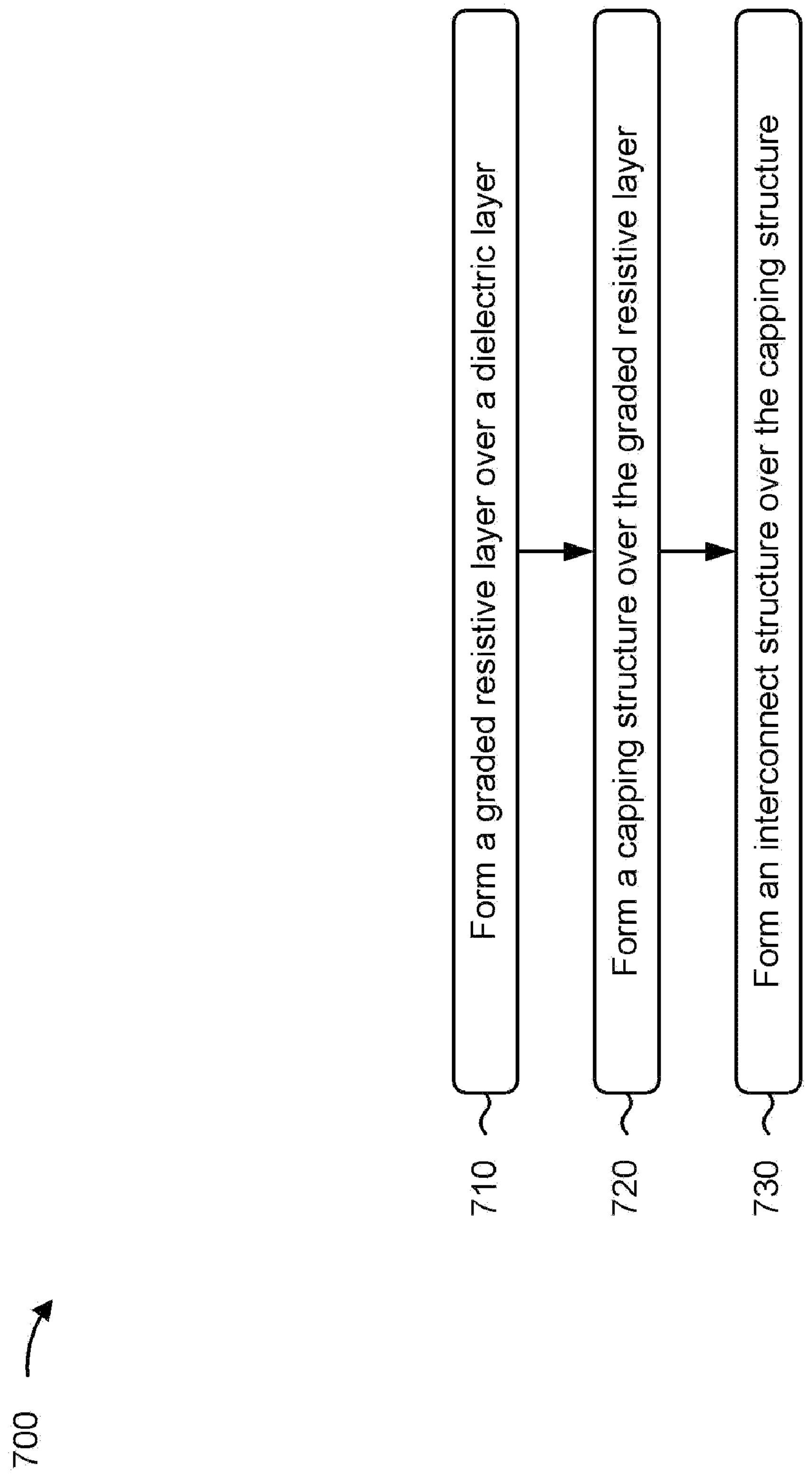
FIG. 7 is a flowchart of an example process associated with forming a semiconductor resistor structure having a graded resistive layer.

FIG. 7 is a flowchart of an example process 700 associated with forming a semiconductor resistor structure having a graded resistive layer. In some implementations, one or more process blocks of FIG. 7 are performed by one or more semiconductor processing tools (e.g., one or more of the semiconductor processing tools 102-112 and/or the wafer/die transport tool 114). Additionally, or alternatively, one or more process blocks of FIG. 7 may be performed by one or more components of device 600, such as processor 620, memory 630, input component 640, output component 650, and/or communication component 660.

As shown in FIG. 7, process 700 may include forming a graded resistive layer over a dielectric layer (block 710). For example, one or more of the semiconductor processing tools 102-112 may form a graded resistive layer (e.g., the graded resistive layer 262) over a dielectric layer (e.g., the dielectric layer 222), as described herein.

As further shown in FIG. 7, process 700 may include forming a capping structure over the graded resistive layer (block 720). For example, one or more of the semiconductor processing tools 102-112 may form a capping structure (e.g., the capping structure 264) over the graded resistive layer, as described herein.

As further shown in FIG. 7, process 700 may include forming an interconnect structure over the capping structure (block 730). For example, one or more of the semiconductor processing tools 102-112 may form an interconnect structure (e.g., one or more of the vias 266) over the capping structure, as described herein.

Process 700 may include additional implementations, such as any single implementation or any combination of implementations described below and/or in connection with one or more other processes described elsewhere herein.

In a first implementation, forming the graded resistive layer over the dielectric layer comprises depositing a layer of a bulk silicon chromium material (e.g., a layer corresponding to the bulk silicon chromium region 308 of FIG.

3A) over the dielectric layer, and depositing a layer of a chromium-rich material (e.g., a layer corresponding to the chromium-rich region 310 of FIG. 3A) on the layer of the bulk silicon chromium material.

In a second implementation, alone or in combination with the first implementation, forming the graded resistive layer over the dielectric layer includes depositing a layer of a bulk silicon chromium material (e.g., a layer corresponding to the bulk silicon chromium region 308 of FIG. 3B) over the dielectric layer, and depositing a layer of a silicon-rich material (a layer corresponding to the silicon-rich region 312 of FIG. 3B) on the layer of the bulk silicon chromium material.

In a third implementation, alone or in combination with one or more of the first and second implementations, forming the graded resistive layer over the dielectric layer further includes depositing a layer of a chromium-rich material (e.g., a layer corresponding to the chromium-rich region 310 of FIG. 3C) on the layer of the silicon-rich material (e.g., a layer corresponding to the silicon-rich region 312 of FIG. 3C).

In a fourth implementation, alone or in combination with one or more of the first through third implementations, forming the graded resistive layer over the dielectric layer includes depositing a layer of a silicon-rich material (e.g., a layer corresponding to the silicon-rich region 312 of FIG. 3D) over the dielectric layer, and depositing a layer of a bulk silicon chromium material (e.g., a layer corresponding to the bulk silicon chromium region 308 of FIG. 3D) on the layer of the silicon-rich material.

In a fifth implementation, alone or in combination with one or more of the first through fourth implementations, forming the graded resistive layer over the dielectric layer further includes depositing a layer of a chromium-rich material (e.g., a layer corresponding to the chromium-rich region 310 of FIG. 3E) on the layer of the bulk silicon chromium material.

In a sixth implementation, alone or in combination with one or more of the first through fifth implementations, forming the graded resistive layer includes depositing a first layer of a silicon-rich material (e.g., a layer corresponding to the silicon-rich region 312*b* of FIG. 3F) over the dielectric layer, depositing a layer of a bulk silicon chromium material (e.g., a layer corresponding to the bulk silicon chromium region 308 of FIG. 3F) on the first layer of the silicon-rich material, and depositing a second layer of a silicon-rich material (e.g., a layer corresponding to the silicon-rich region 312*a* of FIG. 3F) on the layer of the bulk silicon chromium material.

In a seventh implementation, alone or in combination with one or more of the first through sixth implementations, forming the graded resistive layer over the dielectric layer further includes depositing a layer of a chromium-rich material (e.g., a layer corresponding to the chromium-rich region 310 of FIG. 3G) on the second layer of the silicon-rich material.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein include a semiconductor device including a semiconductor resistor structure having and techniques for forming the semiconductor resistor structure. The techniques include forming a layer of a silicon chromium (SiCr) material having different Si/Cr ratios within the layer (e.g., a graded resistive layer) as part of forming the semiconductor resistor structure. The graded resistive layer may compensate for semiconductor manufacturing processes (e.g., etching, oxidation, thermal annealing) that may lead to film damage, thinning, crystallization, or composition drift of the graded resistive layer to enlarge process windows for fabricating the semiconductor resistor structure. The enlarged process window may improve a performance of the semiconductor resistor structure (e.g., a resistance and/or an impedance uniformity) relative to another semiconductor resistor structure fabricated using a uniform layer of a silicon chromium material.

In this way, a performance (e.g., a reliability margin) of a semiconductor device including the semiconductor resistor structure is improved. Improving the performance of the semiconductor device may increase a manufacturing yield, of the semiconductor device, to a particular performance threshold, thereby reducing an amount of resources required to support a market that consumes a volume of the semiconductor device satisfying the particular performance threshold (e.g., semiconductor processing tools, labor, raw material, and/or computing resources).

As described in greater detail above, some implementations described herein provide a semiconductor resistor structure. The semiconductor resistor structure includes an interconnect structure. The semiconductor resistor structure includes a capping structure connected to the interconnect structure below the interconnect structure. The semiconductor resistor structure includes a graded resistive layer connected to the capping structure below the capping structure and including, a bulk silicon chromium region a chromium-rich region.

As described in greater detail above, some implementations described herein provide a semiconductor resistor structure. The semiconductor resistor structure includes an interconnect structure. The semiconductor resistor structure includes a capping structure connected to the interconnect structure below the interconnect structure. The semiconductor resistor structure includes a graded resistive layer connected to the capping structure below the capping structure and including, a bulk silicon chromium region a silicon-rich region.

As described in greater detail above, some implementations described herein provide a method. The method includes forming a graded resistive layer over a dielectric layer. The method includes forming a capping structure over the graded resistive layer. The method includes forming an interconnect structure over the capping structure.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor resistor structure, comprising:
- an interconnect structure;
- a capping structure connected to the interconnect structure below the interconnect structure; and
- a graded resistive layer connected to the capping structure below the capping structure and comprising:
  - a bulk silicon chromium region; and
  - a chromium-rich region.

2. The semiconductor resistor structure of claim 1, wherein the chromium-rich region comprises:
- a thickness that is included in a range of approximately 5 angstroms to approximately 50 angstroms.

3. The semiconductor resistor structure of claim 1, wherein the chromium-rich region is above the bulk silicon chromium region.

4. The semiconductor resistor structure claim 3, wherein the graded resistive layer further comprises:
- a silicon-rich region,
  - wherein the silicon-rich region is below the bulk silicon chromium region.

5. The semiconductor resistor structure claim 3, wherein the graded resistive layer further comprises:
- a silicon-rich region,
  - wherein the silicon-rich region is above the bulk silicon chromium region, and
  - wherein the silicon-rich region is below the chromium-rich region.

6. The semiconductor resistor structure claim 5, wherein the silicon-rich region is a first silicon-rich region and the graded resistive layer further comprises:
- a second silicon-rich region below the bulk silicon chromium region.

7. A semiconductor resistor structure, comprising:
- an interconnect structure;
- a capping structure connected to the interconnect structure below the interconnect structure; and
- a graded resistive layer connected to the capping structure below the capping structure and comprising:
  - a bulk silicon chromium region; and
  - a silicon-rich region.

8. The semiconductor resistor structure of claim 7, wherein the silicon-rich region comprises:
- a thickness that is included in a range of approximately 5 angstroms to approximately 40 angstroms.

9. The semiconductor resistor structure of claim 7, wherein the silicon-rich region comprises:
- a thickness that is included in a range of approximately 5 angstroms to approximately 100 angstroms.

10. The semiconductor resistor structure of claim 7, wherein the silicon-rich region is below the bulk silicon chromium region.

11. The semiconductor resistor structure of claim 7, wherein the silicon-rich region is above the bulk silicon chromium region.

12. The semiconductor resistor structure of claim 11, wherein the silicon-rich region is a first silicon-rich region and the graded resistive layer further comprises:
- a second silicon-rich region below the bulk silicon chromium region.

13. A method, comprising:
- forming a graded resistive layer, comprising silicon chromium, over a dielectric layer;
- forming a capping structure over the graded resistive layer; and
- forming an interconnect structure over the capping structure.

14. The method of claim 13, wherein forming the graded resistive layer over the dielectric layer comprises:
- depositing a layer of a bulk silicon chromium material over the dielectric layer; and
- depositing a layer of a chromium-rich material on the layer of the bulk silicon chromium material.

15. The method of claim 13, wherein forming the graded resistive layer over the dielectric layer comprises:
- depositing a layer of a bulk silicon chromium material over the dielectric layer; and
- depositing a layer of a silicon-rich material on the layer of the bulk silicon chromium material.

16. The method of claim 15, wherein forming the graded resistive layer over the dielectric layer further comprises:
- depositing a layer of a chromium-rich material on the layer of the silicon-rich material.

17. The method of claim 13, wherein forming the graded resistive layer over the dielectric layer comprises:
- depositing a layer of a silicon-rich material over the dielectric layer; and
- depositing a layer of a bulk silicon chromium material on the layer of the silicon-rich material.

18. The method of claim 17, wherein forming the graded resistive layer over the dielectric layer further comprises:
- depositing a layer of a chromium-rich material on the layer of the bulk silicon chromium material.

19. The method of claim 13, wherein forming the graded resistive layer comprises:
- depositing a first layer of a silicon-rich material over the dielectric layer;
- depositing a layer of a bulk silicon chromium material on the first layer of the silicon-rich material; and
- depositing a second layer of the silicon-rich material on the layer of the bulk silicon chromium material.

20. The method of claim 19, wherein forming the graded resistive layer over the dielectric layer further comprises:
- depositing a layer of a chromium-rich material on the second layer of the silicon-rich material.

* * * * *